(12) United States Patent
Tyan et al.

(10) Patent No.: US 6,917,159 B2
(45) Date of Patent: Jul. 12, 2005

(54) MICROCAVITY OLED DEVICE

(75) Inventors: Yuan-Sheng Tyan, Webster, NY (US); Giuseppe Farruggia, Webster, NY (US); Joel D. Shore, Rochester, NY (US); Joseph C. Deaton, Rochester, NY (US); Steven A. Van Slyke, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 65 days.

(21) Appl. No.: 10/640,907

(22) Filed: Aug. 14, 2003

(65) Prior Publication Data

US 2005/0037232 A1 Feb. 17, 2005

(51) Int. Cl.⁷ .................................................. H01J 1/62
(52) U.S. Cl. ........................ 313/506; 313/503; 313/504
(58) Field of Search ................................ 313/498, 503, 313/504, 506

(56) References Cited

U.S. PATENT DOCUMENTS

| | | | |
|---|---|---|---|
| 4,769,292 A | 9/1988 | Tang et al. | |
| 5,780,174 A | 7/1998 | Tokito et al. | |
| 6,326,224 B1 | 12/2001 | Xu et al. | |
| 6,406,801 B1 | 6/2002 | Tokito et al. | |
| 6,563,261 B1 * | 5/2003 | Nakayama et al. | 313/504 |

FOREIGN PATENT DOCUMENTS

| | | |
|---|---|---|
| EP | 1 154 676 | 11/2001 |
| JP | 11-288786 | 10/1999 |

OTHER PUBLICATIONS

"High efficiency top–emitting organic light–emitting devices" by M.–H. Lu et al., Applied Physics Letters, vol. 81, No. 21, Nov. 18, 2002.

"Microcavity organic light–emitting diodes on silicon" by Frederique Jean et al., Applied Physics Letters, vol. 81, No. 9, Aug. 26, 2002.

"Control of emission characteristics in organic thin–film electroluminescent diodes using an optical–microcavity structure" by Noriyuki Takada et al., Applied Physics Letters, 63, (15), Oct. 11, 1993.

"Polymer light–emitting diodes placed in microcavities" by M. Berggren et al., Snythetic Metals 76 (1996) 121–123.

"Efficiency enhancement of microcavity organic light emitting diodes" by R. H. Jordan et al., Applied Physics Letters 69 (14), Sep. 30, 1996.

"Physics and Device applications of optical microcavities" by H. Yokoyama, Science vol. 256, Apr. 3, 1992.

"Electroluminescence of doped organic thin films", by C. W. Tang et al., J. Applied Physics 65 (9), May 1, 1989.

"Organic Electroluminescent diodes" by C. W. Tang et al., Applied Physics Letters 51 (12) Sep. 21, 1987.

"Phosphorescent top–emitting organic light–emitting devices with improved light outcoupling", by H. Riel et al., Applied Physics Letters, vol. 82, No. 3, Jan. 20, 2003.

* cited by examiner

*Primary Examiner*—Vip Patel
(74) *Attorney, Agent, or Firm*—Raymond L. Owens

(57) ABSTRACT

A microcavity OLED device including a substrate; a metallic bottom-electrode layer disposed over the substrate; a metallic top-electrode layer spaced from the metallic bottom-electrode layer; and an organic EL medium structure having a defined thickness, and including a light-emitting layer comprising a host material and at least one dopant disposed between the top-electrode layer and the bottom-electrode layer; wherein one of the metallic electrode layers is light transmissive and the other one is essentially opaque and reflective; wherein the material for reflective metallic electrode layer includes Ag, Au, Al, or alloys thereof, and the material for the light transmissive metallic electrode layer includes Ag, Au, or alloys thereof. The at least one dopant is selected to generate one of red, green, or blue light in the light-emitting layer. The defined thickness of the EL medium structure is selected so that the microcavity OLED device is tuned for emission of one of red, green, or blue light through the light transmissive electrode layer.

74 Claims, 14 Drawing Sheets

MICROCAVITY OLED DEVICE

CROSS REFERENCE TO RELATED APPLICATIONS

Reference is made to commonly assigned U.S. patent application Ser. No. 10/346,424 filed Jan. 17, 2003 entitled "Microcavity OLED Devices" by Yuan-Sheng Tyan et al.; U.S. patent application Ser. No. 10/368,513 filed Feb. 18, 2003 entitled "Tuned Microcavity Color OLED Display" by Yuan-Sheng Tyan et al.; U.S. patent application Ser. No. 10/356,271 filed Jan. 31, 2003 entitled "Color OLED Display with Improved Emission" by Yuan-Sheng Tyan et al.; and U.S. patent application Ser. No. 10/347,013 filed Jan. 17, 2003, entitled "Organic Light Emitting Diode (OLED) Display With Improved Light Emission Using Metallic Anode" by Pranab K. Raychaudhuri et al., the disclosures of which are incorporated herein by reference.

FIELD OF INVENTION

The present invention relates to an improved tuned microcavity color OLED display device.

BACKGROUND OF INVENTION

Organic electroluminescent (EL) devices or organic light emitting diodes (OLEDs) are electronic devices that emit light in response to an applied potential. Tang et al. in Applied Physics Letters 51, p913, 1987; Journal of Applied Physics, 65, p3610, 1989; and commonly assigned U.S. Pat. No. 4,769,292 demonstrated highly efficient OLEDs. Since then, numerous OLEDs with alternative layer structures, including polymeric materials, have been disclosed and device performance has been improved. FIG. 1 illustrates schematically the cross-sectional view of a prior art bottom-emitting OLED. Prior art bottom-emitting OLED device 101 includes a substrate 10, a transparent bottom-electrode 12a, an organic EL medium structure 14, and a reflective metallic top-electrode 16R. The organic EL medium structure can include one or more sublayers including a hole-injecting layer (HIL) 14a (not shown), a hole-transporting layer (HTL) 14b, a light emitting layer (LEL) 14c, an electron-transporting layer (ETL) 14d, and an electron-injecting layer (EIL) 14e (not shown). In FIG. 1 the transparent bottom-electrode 12a is the anode and the reflective metallic top-electrode 16R is the cathode; but the reverse can also be the case and if so the order of the sublayers in the organic EL medium structure 14 is reversed.

The luminance output efficiency is an important figure of merit parameter of an OLED device. It determines how much current or power is needed to drive an OLED to deliver a desired level of light output. In addition, since the lifetime of an OLED device correlates inversely to the operating current, a higher output efficiency OLED device lasts longer at an identical light output level.

A method that has been studied to improve luminance output efficiency of an OLED device is to use the microcavity effect. OLED devices utilizing microcavity effect (microcavity OLED devices) have been disclosed in the prior art (U.S. Pat. Nos. 6,406,801 B1; 5,780,174, and JP 11-288786). In a microcavity OLED device the organic EL medium structure is disposed between two highly reflecting mirrors, one of which is light transmissive. The reflecting mirrors form a Fabry-Perot microcavity that strongly modifies the emission properties of the organic EL medium structure disposed in the microcavity. Emission near the wavelength corresponding to the resonance wavelength of the cavity is enhanced through the light transmissive mirror and those with other wavelengths are suppressed. The use of a microcavity in an OLED device has been shown to reduce the emission bandwidth and improve the color purity, or chromaticity, of emission (U.S. Pat. No. 6,326,224 B1). The microcavity also dramatically changes the angular distribution of the emission from an OLED device. There also have been suggestions that the luminance output could be enhanced by the use of a microcavity (Yokoyama, Science, Vol. 256, p66, 1992; Jordan et al. Appl. Phys. Lett. 69, p1997, 1996). In most the reported cases, however, at least one of the reflecting mirrors is a Quarter Wave Stack (QWS). A QWS is a multi-layer stack of alternating high index and low index dielectric thin-films, each one a quarter wavelength thick. It can be tuned to have high reflectance, low transmittance, and low absorption over a desired range of wavelengths.

FIG. 2 illustrates schematically the cross-sectional view of an exemplary prior art QWS based microcavity OLED device 102. QWS based microcavity OLED device 102 includes a substrate 10, a QWS reflecting mirror 18 as a light transmissive reflector, a transparent bottom-electrode 12a, an organic EL medium structure 14, and a reflective metallic top-electrode 16R. A typical QWS reflecting mirror 18 is of the form $TiO_2:SiO_2:TiO_2:SiO_2:TiO_2$ with $TiO_2$ n=2.45 and $SiO_2$ n=1.5 as in Jordan et al. Appl. Phys. Lett. 69, p1997, 1996. Thickness of each material is 56 nm and 92 nm, respectively, corresponding to quarter wavelength for green emission at 550 nm. In operation only a narrow band light centered at the resonance wavelength of 550 nm is emitted through the QWS layer out of the microcavity OLED device.

A QWS is complicated in structure and expensive to fabricate. The resonance bandwidth is extremely narrow and, as a result, even though a microcavity based on a QWS is capable of greatly increasing the emission peak height at the resonance wavelength, the total luminance integrated over wavelength is much less improved and can actually decrease over a similar device without the microcavity. In addition, the dielectric layers are not electrically conductive. To form a functional OLED device, a separate transparent conductive electrode layer needs to be disposed between the QWS and the organic layers. This added conductive electrode layer further complicates the structure. If a transparent conductive oxide is used as the conductive electrode, the electrical conductance is limited and can be inadequate for many devices especially those having large areas. If a thin metal film is used, the cavity structure is much more complicated and device performance can be compromised. QWS-based microcavity OLED devices are therefore not suitable for practical microcavity OLED device applications.

It is generally believed, however, that a QWS constructed of non-absorbing dielectric materials is necessary in achieving useful microcavity effects. Yokoyama, Science, Vol. 256, p66, 1992 specifically recommended the use of a QWS instead of metallic mirrors. Published attempts to replace the QWS with the more practical metal mirrors have not been very successful. Berggren et al. in Synthetic Metals 76, p121, 1996 studied a PLED using an Al opaque mirror and a Ca—Al light transmissive mirror to construct a microcavity. Although some bandwidth narrowing was observed suggesting a microcavity effect, the external quantum efficiency of the device with microcavity was a factor of three less than a similar device without a microcavity. Takada et al. in Appl. Phys. Lett. 63, p2032, 1993 constructed a microcavity OLED device using a light transmissive (36 nm) Ag cathode and a 250 nm MgAg opaque anode.

Although angular distribution change and emission bandwidth reduction were observed, the emission intensity was significantly reduced compared with a non-cavity case. The authors concluded that the combination of emission dyes with broad emission spectra and a simple planar cavity was not satisfactory for the confinement of light in the microcavity, and encouraged development of new cavity structures. Jean et al. in Appl. Phys. Lett., Vol. 81, p1717, 2002 studied an OLED structure using a 100 nm Al as the opaque anode and a 30 nm Al as the light transmissive cathode to construct a microcavity structure. Although a strong microcavity effect caused emission bandwidth narrowing and a strong angular dependence was observed, no improvement in emission output efficiency was suggested. In fact judging from the extremely narrow emission bandwidth of the devices, the emission output efficiency was most likely decreased. EP 1 154 676 A1 disclosed an organic EL device having a bottom-electrode of a light reflective material, an organic light emitting layer, a light transmissive reflection layer, and a top-electrode of a transparent material forming a cavity structure. The objective was to achieve an OLED device with sufficient color reproduction range over a wide viewing angle. The objective was achieved by reducing the microcavity effect to achieve a large emission bandwidth. Although it alleged that multiple reflection enhances resonance wavelength emission, no actual or simulated data supported the suggestion. All examples used a Cr reflective anode. Our studies showed that little luminance enhancement is achievable when an anode with reflectivity as low as Cr is used.

Lu et al. in Appl. Phys. Lett., Vol. 81, p3921, 2002 described top-emitting OLED devices that the authors alleged to have performance enhanced by microcavity effects. However, their performance data showed very little angular dependence characteristic of microcavities. Although no spectral data were shown, the similarity in color coordinates between their non-cavity bottom-emitting structure and microcavity top-emitting structure suggests that the bandwidth narrowing effect expected in microcavity OLED devices is most likely absent as well. Indeed, our model calculations confirm that their structure should not produce a significant microcavity effect. Thus, the observed emission enhancement is most likely a result of normal modest optical interference effects typically seen in non-microcavity OLED devices. The magnitude of the emission enhancement is very small and the color quality improvement is absent. The authors also suggested that the best efficiency is achieved by using a high reflectivity anode and a transparent cathode, the latter being clearly contrary to the teaching of the present invention. H. Riel, S. Karg, T. Beierlein, B. Ruhstaller, and W. Rieb, Appl. Phys. Lett., Vol. 82, p466, 2003 reported a microcavity OLED device using a phosphorescent emitter and a dielectric layer over the semitransparent metal electrode. Although the device efficiency was much improved compared to similar microcavity devices without the dielectric layer, the extent of improvement over the corresponding non-microcavity device is not clear.

SUMMARY OF THE INVENTION

It is an object of the present invention to provide a microcavity OLED device with improved luminance efficiency and color quality.

It is a further object of the present invention to provide a microcavity OLED device that can be easily fabricated.

It is another object of the present invention to provide a microcavity OLED device with a low internal series resistance to reduce the power loss.

In one aspect, these objects are achieved by providing a microcavity OLED device having improved luminance efficiency and improved chromaticity of emitted light, comprising:

a) a substrate;

b) a microcavity having a selected cavity length defined over one substrate surface by, in sequence, a metallic bottom-electrode layer, an organic electroluminescent (EL) medium structure, and a metallic top-electrode layer, wherein one of the metallic electrode layers is light transmissive and the other one is substantially opaque and reflective;

wherein the material for the light transmissive electrode layer includes Ag, Au, or alloys thereof, and the material for the opaque and reflective electrode layer includes Ag, Au, Al, or alloys thereof;

wherein the organic EL medium structure includes at least a light-emitting layer comprised of at least one organic host material and at least one dopant material dispersed in the at least one host material;

wherein the selected cavity length is provided by selection of a thickness of at least one of the organic layers;

wherein the at least one dopant material is selected from the class of fluorescent dyes consisting of derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl) amine boron compounds, bis(azinyl)methane compounds, and carbostyryl compounds, so that one of red, green, or blue light is generated in the light-emitting layer; or the class of phosphorescent compounds consisting of cyclometallated Ir(III) complexes, cyclometallated Pt(II) complexes, Pt(II) porphyrin complexes, and trivalent lanthanide complexes, so that one of red, green, or blue light is generated in the light-emitting layer; and wherein the selected cavity length of the microcavity OLED device is tuned to provide a resonance condition for emission of one of red, green, or blue light through the light transmissive electrode layer and having the improved luminance efficiency and the improved chromaticity.

In another aspect, these objects are also achieved by providing a full-color microcavity OLED display device including red, green, and blue subpixels and having improved luminance efficiency and improved chromaticity of red, green, and blue light emitted from corresponding subpixels, comprising:

a) a substrate;

b) a microcavity defined over one substrate surface by, in sequence, a metallic bottom-electrode layer, an organic electroluminescent (EL) medium structure, and a metallic top-electrode layer, wherein the microcavity has a different selected cavity length for each of the red, green, and blue sub-pixels;

wherein one of the metallic electrode layers is light transmissive and the other one is substantially opaque and reflective;

wherein the material for the light transmissive electrode layer includes Ag, Au, or alloys thereof, and the material for the opaque and reflective electrode layer includes Ag, Au, Al, or alloys thereof;

wherein the organic EL medium structure includes at least a pixelated light-emitting layer comprised of at least one organic host material and at least one different dopant material dispersed in the at least one host material in correspondence with the red, green, and blue subpixels;

wherein the different selected cavity length is provided by selection of a thickness of at least one pixelated organic layer;

wherein the at least one dopant material is selected to generate red light, another at least one dopant material is selected to generate green light, and another at least one dopant material is selected to generate blue light in the light-emitting layer;

wherein each of the at least one dopant materials is selected from the class of fluorescent dyes consisting of derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl) methane compounds, and carbostyryl compounds; or the class of phosphorescent compounds consisting of cyclometallated Ir(III) complexes, cyclometallated Pt(II) complexes, Pt(II) porphyrin complexes, and trivalent lanthanide complexes, so that one of red, green, or blue light is generated in the light-emitting layer; and wherein each of the different selected cavity length is selected so that the microcavity of each of the red, green, and blue subpixels of the full-color microcavity OLED display device is tuned to provide a resonance condition for emission of red, green, or blue light, respectively, through the light transmissive electrode layer and having the improved luminance efficiency and the improved chromaticity.

Figure 1:
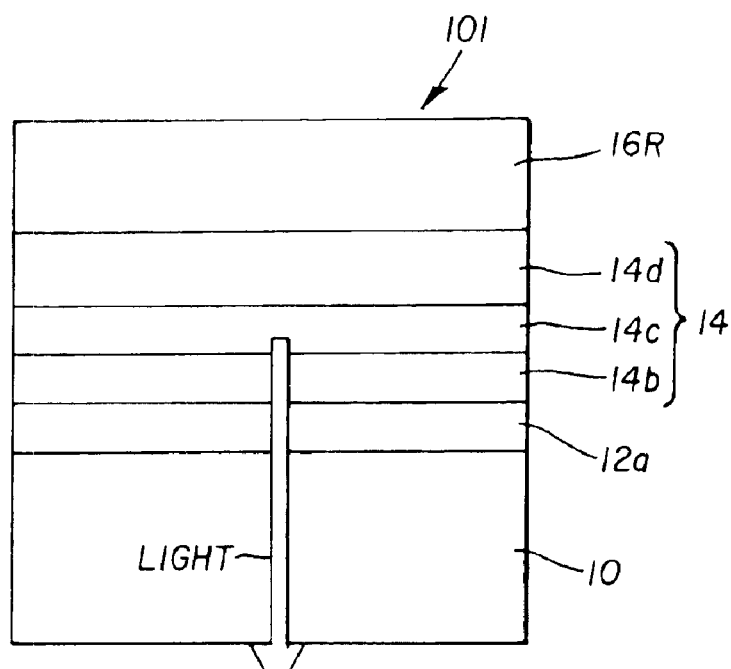
FIG. 1 is a schematic cross-sectional view of a prior art OLED device.
Figure 2:
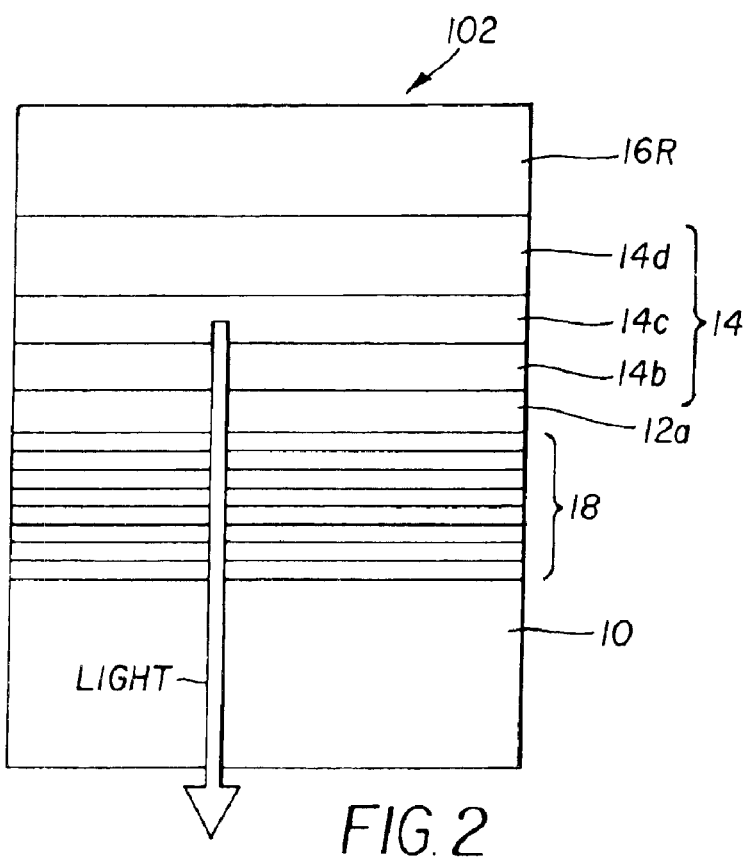
FIG. 2 is a schematic cross-sectional view of a prior art microcavity OLED device based on a QWS.

The drawings are necessarily of a schematic nature since layer thicknesses are frequently in the sub-micrometer ranges, while features representing lateral device dimensions can be in a range from 10 micrometer to several 100 micrometer. Accordingly, the drawings of devices are scaled for ease of visualization rather than for dimensional accuracy.

DETAILED DESCRIPTION OF THE PREFERRED EMBODIMENTS

As used herein, the term "transparent" refers to a conductive phase-layer, an absorption-reducing layer, or a substrate, and denotes an optical transmission of more than 90% of light directed perpendicularly at a surface of such element. The term "light transmissive" refers to the metallic electrode through which light is to be transmitted, and denotes an optical transmission of between 20% and 90% of light directed perpendicularly at a surface of such metallic electrode. The terms "reflective" and "opaque" refer to the metallic electrode through which light is not to be transmitted, and denotes a mirror-like optical reflectivity and an optical transmission of less than 5% of light directed perpendicularly at a surface of such metallic electrode. The terms "pixel" and "subpixel" are generally used to designate the smallest addressable element of an OLED display device. For monochrome OLED devices designed to emit one of red, green, blue, or white light, there is no distinction between a pixel and a subpixel. In multicolor displays, or in full-color (R, G, B) OLED displays, a pixel is constituted of a red-light emitting subpixel, a green-light emitting subpixel, and a blue-light emitting subpixel, wherein each of these subpixels can be independently addressed to emit light of a specific color.

In a preferred embodiment of the present invention the microcavity OLED device includes a metallic bottom-electrode layer disposed over the substrate and a metallic top-electrode layer spaced from the metallic bottom-electrode layer. The spacing between the metallic top-electrode layer and the metallic bottom-electrode layer defines the cavity length. An organic EL medium structure containing at least a doped light-emitting layer is disposed between the bottom and top-electrode layers. In view of the teaching and the unsuccessful attempts of the prior art, the present inventors discovered quite unexpectedly through extensive modeling and experimental efforts that high performance microcavity OLED devices that enhance the light emission output efficiency and color quality can actually be fabricated using all metallic mirrors. It was discovered that the material selection for both the reflective and the light transmissive metallic electrodes is important and the thickness of the light transmissive metallic electrode is also important. Only a small number of metals, including Ag, Au, Al, or alloys thereof, defined as alloys having at least 50 atomic percent of at least one of these metals, are preferably used as the reflective electrode. When other metals are used, the benefits of luminance output increase and color quality improvement due to microcavity effect are much reduced. Similarly, for the light transmissive electrode only a small number of materials including Ag, Au, or alloys thereof are preferably used. The thickness range of the light transmissive electrode is also limited. Too thin a layer does not provide a significant microcavity effect and too thick a layer reduces the luminance output. In addition, the location of the light-emitting layer within the microcavity also strongly affects the luminance output and needs to be optimized. Only with a proper optimization of all these factors can a microcavity OLED device with emission output efficiency and color quality significantly improved over that of corresponding non-cavity OLED devices be achieved. The present inventors further discovered that an absorption-reducing layer disposed next to the light transmissive electrode layer outside the microcavity further improves the luminance performance of a microcavity device.

Metallic mirrors are simpler in structure and easier to fabricate than a QWS. The use of two metallic mirrors that also function as electrodes eliminates the need for a separate transparent conductive electrode. The sheet conductivity of the light transmissive metallic electrode can be much higher than the transparent conductive electrodes used in the prior art. The increased conductivity reduces Ohmic loss in an OLED device, especially if the device area is large. The emission bandwidths using appropriately designed metallic mirrors are broader than those obtained using QWS and hence the luminance output is increased. On the other hand, the emission bandwidth is still narrow enough to provide excellent color selectivity and color quality, also referred to as chromaticity.

The metallic bottom-electrode layer can be the light transmissive one, in which case the microcavity OLED device in accordance with the present invention is bottom-emitting. Alternatively, the metallic top-electrode can be the light transmissive one, in which case the microcavity OLED device in accordance with the present invention is top-emitting. For the bottom-emitting microcavity OLED device, the substrate is transparent to the emitted light from the device. The substrate can be made of glass, plastic, or other suitable transparent materials. For the top-emitting microcavity OLED device, the substrate does not need to be transparent to the emitted light and can be made of metallic, ceramic, or other suitable substances.

The metallic bottom-electrode can be the anode and the metallic top-electrode can be the cathode. Alternatively, the metallic bottom-electrode can be the cathode and the metallic top-electrode can be the anode. In either case, the organic EL medium structure is appropriately orientated so that the hole-injecting and hole-transporting layers are closer to the anode and the electron-injecting and electron-transporting layers are closer to the cathode.

In one embodiment of the present invention, a transparent conductive phase-layer can be inserted between the organic EL medium structure and one of the metallic electrodes. This phase-layer is used as an alternative way to adjust the microcavity cavity length and hence the resonance frequency of the microcavity. Since only through-thickness current conduction is important, the electrical resistivity of the materials can be as high as $10^7$ Ohm-cm without imparting significant voltage load to the OLED device. Many of the commonly known oxides, nitrides, sulfides, organic polymers, and organic compounds can be used for such a purpose. Some examples such as indium-tin oxide (ITO), zinc-tin oxide (ZTO), tin oxide ($SnO_x$), indium oxide ($InO_x$), molybdenum oxide ($MoO_x$), tellurium oxide ($TeO_x$), antimony oxide ($SbO_x$), and zinc oxide ($ZnO_x$), can be used.

Since not all the preferred materials for the metallic electrodes or the transparent conductive phase-layer provide good charge injection, the organic EL medium structure preferably includes a hole-injecting layer next to the HTL and/or an electron-injecting layer next to the ETL. Suitable materials for use as the hole-injecting layer include, but are not limited to, porphyrinic compounds as described in commonly assigned U.S. Pat. No. 4,720,432, and plasma-deposited fluorocarbon polymers as described in commonly assigned U.S. Pat. No. 6,208,075. Alternative hole-injecting materials reportedly useful in organic EL devices are described in EP 0 891 121 A1 and EP 1 029 909 A1 and by Tokito et al. J. Phys. D. Vol. 29, p2750, 1996 including vanadium oxide (VOx), molybdenum oxide (MoOx), nickel oxide (NiOx), etc. Electron-injecting layers including those taught in U.S. Pat. Nos. 5,608,287; 5,776,622; 5,776,623; 6,137,223; and 6,140,763, the disclosures of which are here incorporated by reference, can be employed. A thin-film containing low work-function alkaline metals or alkaline earth metals, such as Li, Cs, Ca, Mg can be employed. In addition, an organic material doped with these low work-function metals can also be used effectively as the electron-injecting layer. Examples are Li- or Cs-doped Alq.

In some cases, materials used for the metal electrodes cause instability in an OLED device due to chemical interactions, electro-migration, or other causes. A suitable barrier layer can be used to prevent such instabilities. The barrier layer can be placed between the metal electrode and the electron-injecting or hole-injecting layer. Again, the presence of a good electron-injecting or hole-injecting layer allows a wide range of materials options for such a purpose.

The organic EL medium structure 14 has at least one light-emitting layer, but commonly it comprises several layers. An exemplary organic EL medium structure can include a hole-injecting layer 14a, a hole-transporting layer 14b, a light-emitting layer 14c, an electron-transporting layer 14d, and an electron-injecting layer 14e. The organic EL medium structure can be based on small molecule OLED materials, or it can be based on polymer OLED materials. A device based on polymer OLED materials is often referred to as a PLED.

The hole-transporting layer 14b of the organic EL medium structure includes a compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The hole-transporting layer can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N-Phenylcarbazole
Poly(N-vinylcarbazole)
N,N'-di-1-naphthalenyl-N,N'-diphenyl-4,4'-diaminobiphenyl
4,4'-Bis[N-(1-naphthyl)-N-phenylamino]biphenyl
4,4''-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4''-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4''-diamino-p-terphenyl
4,4'-Bis {N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

As more fully described in commonly assigned U.S. Pat. Nos. 4,769,292 and 5,935,721, the light-emitting layer (LEL) of the organic EL medium structure includes at least one fluorescent material or at least one phosphorescent material where electroluminescence is produced as a result of electron-hole pair recombination in this region. The light-emitting layer can include a single material, but more commonly consists of at least one host material doped with a guest compound or compounds where light emission comes primarily from the dopant or from dopants and can be of any color. The host material in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material(s). Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host(s) to the dopant(s), a necessary condition is that the band gap energy level of the dopant is smaller than that of the host material.

Host and emitting molecules known to be of use include, but are not limited to, those disclosed in commonly assigned U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful electron-transporting host compounds capable of supporting electroluminescence. Illustrative of useful chelated oxinoid compounds are the following:

CO-1: Aluminum trisoxine [alias, tris(8-quinolinolato) aluminum(III)]
CO-2: Magnesium bisoxine [alias, bis(8-quinolinolato) magnesium(II)]
CO-3: Bis[benzo{f}-8-quinolinolato]zinc (II)
CO-4: Bis(2-methyl-8-quinolinolato)aluminum(III)-$\mu$-oxo-bis(2-methyl-8-quinolinolato) aluminum(III)
CO-5: Indium trisoxine [alias, tris(8-quinolinolato) indium]
CO-6: Aluminum tris(5-methyloxine) [alias, tris(5-methyl-8-quinolinolato) aluminum(III)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato) zirconium(IV)]

Other classes of useful host materials include, but are not limited to, derivatives of anthracene, such as 9,10-di-(2-naphthyl)anthracene and derivatives thereof, distyrylarylene derivatives as described in U.S. Pat. No. 5,121,029, and benzazole derivatives, for example, 2,2',2''-(1,3,5-phenylene)tris[1-phenyl-1H-benzimidazole].

Useful fluorescent dopants include, but are not limited to, derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, fluorene derivatives, periflanthene derivatives, and carbostyryl compounds.

Phosphorescent dopants for OLEDs have been disclosed in WO 98/55561; WO 00/18851; WO 00/57676; WO 00/70655; WO 01/41512; WO 02/15645; WO 02/02714 A2; U.S. Patent Application Publications 2002/0134984 A1 and 2002/0100906 A1; EP 1 211 257 A2; EP 1 238 981 A2; EP 1 239 526 A2; and EP 1 244 155 A2. An important class among these are cyclometallated Ir(III) complexes of the type $IrL_3$ and $IrL_2L'$ such as the green-emitting fac-tris(2-phenylpyridinato-N,$C^{2'}$)Iridium(III) ($Ir(ppy)_3$) and bis(2-phenylpyridinato-N,$C^{2'}$) Iridium (III)(acatylacetonate)(Ir $(ppy)_2(acac)$) shown below.

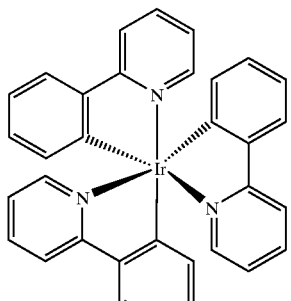

Ir(ppy)₃

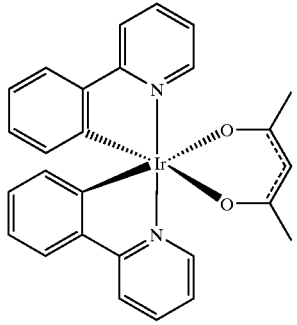

Ir(ppy)₂(acac)

In this class of compounds, the emission wavelengths may be shifted by substitution of electron donating or withdrawing groups at appropriate positions on the cyclometallating ligand L, or by choice of different heterocycles for the cyclometallating ligand L. The emission wavelengths may also be shifted by choice of the ancillary ligand L'. Examples of red emitters are the bis(2-(2'-benzothienyl)pyridinato-N, $C^{3'}$) Iridium(III)(acetylacetonate) and tris(1-phenylisoquinolinato-N,$C^{2'}$)Iridium(III). A blue-emitting example is bis(2-(4,6-diflourophenyl)-pyridinato-N,$C^{2'}$) Iridium(III)(picolinate). Other important phosphorescent dopants include cyclometallated Pt(II) complexes such as cis-bis(2-phenylpyridinato-N,$C^{2'}$)platinum(II), cis-bis(2-(2'-thienyl)pyridinato-N,$C^{3'}$) platinum(II), cis-bis(2-(2'-thienyl) quinolinato-N,$C^{5'}$) platinum(II), or (2-(4,6-diflourophenyl) pyridinato-N$C^{2'}$) platinum (II) acetylacetonate.

Pt(II) porphyrin complexes such as 2,3,7,8,12,13,17,18-octaethyl-21H, 23H-porphine platinum(II) are also useful phosphorescent dopants. Without being limited to a particular theory, phosphorescence may be found among transition metal ion octahedral complexes having $d^6$ electron configuration and square planar complexes having $d^8$ electron configuration, each also having as the lowest energy excited state a metal-to-ligand charge transfer transition or a ligand pi-pi* transition that is capable of mixing with a nearby metal-to-ligand charge transfer. Suitable transition metal ions for phosphorescent complexes include preferably the second or third transition series, or more preferably the third transition series (Hf, Nb, W, Re, Os, Ir, Pt, Au).

Other examples of phosphorescent compounds include compounds having interactions between atoms having $d^{10}$ electron configuration, such as $Au_2(dppm)Cl_2$ (dppm=bis (diphenylphosphino)methane) (Y. Ma et al., Appl. Phys. Lett., 74, p1361–1363, 1998). Still other examples of phosphorescent dopants include coordination complexes of the trivalent lanthanides such as $Tb^{3+}$ and $Eu^{3+}$ (J. Kido et al., Appl. Phys. Lett., 65, p2124, 1994). While these latter dopants do not have triplets as the lowest excited states, their optical transitions do involve a change in spin state of 1 and thereby can harvest the triplets in OLEDs.

Suitable host molecules for phosphorescent dopants must have the energy of their lowest triplet excited states at least about equal to or greater than that of the phosphorescent dopant in order that the triplet exciton be resident mainly on the phosphorescent dopant. However, the band gap of the host should not be chosen so large as to cause an unacceptable increase in the drive voltage of the OLEDs. Suitable host types are described in WO 00/70655 A2; WO 01/39234 A2; WO 01/93642 A1; WO 02/074015 A2; and WO 02/15645 A1. Suitable host materials include certain aryl amines and aryl-substituted carbazole compounds. An important example is 4,4'-N,N'-dicarbazole-biphenyl (CBP), shown below. Other suitable host materials include aryl-substituted oxadiazoles, aryl-substituted triazoles, aryl-substituted phenanthrolines, and metal quinoxolates.

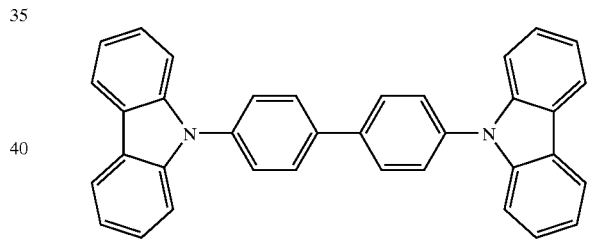

CBP

In addition to suitable host materials, OLEDs employing phosphorescent dopants often require exciton or hole-blocking layers to help confine the excitons or electron-hole recombination to the light-emitting layer comprising the host(s) and dopant(s). In one embodiment, such a blocking layer would be placed between the electron-transporting layer and the light-emitting layer. In this case, the ionization potential of the blocking layer should be such that there is an energy barrier for hole migration from the host into the electron-transporting layer, while the electron affinity should be such that electrons pass more readily from the electron-transporting layer into the light-emitting layer. It is further desired, but not absolutely required, that the triplet energy of the blocking material be greater than that of the phosphorescent dopant(s). Suitable blocking materials are described in 00/70655 A2 and 01/93642 A1. Two examples are bathocuproine (BCP) and bis(2-methyl-8-quinolinolato)(4-phenylphenolato)Aluminum(III) (BAlQ).

The present invention can be applied to an active-matrix OLED device in which a thin-film-transistors (TFT) structure is used in an active-addressing scheme (U.S. Pat. Nos. 5,684,365, and 5,550,066). In an active-matrix microcavity OLED device, each pixel is provided with a number of thin-film transistors, other components such as capacitors, and a connecting pad that electrically contacts the metallic bottom-electrode. The present invention can also be applied to a passive-matrix OLED device in which the intersect of the two electrodes define the pixels. In each case each pixel is designed to be a microcavity device according to the teaching of the present invention.

Figure 3A:
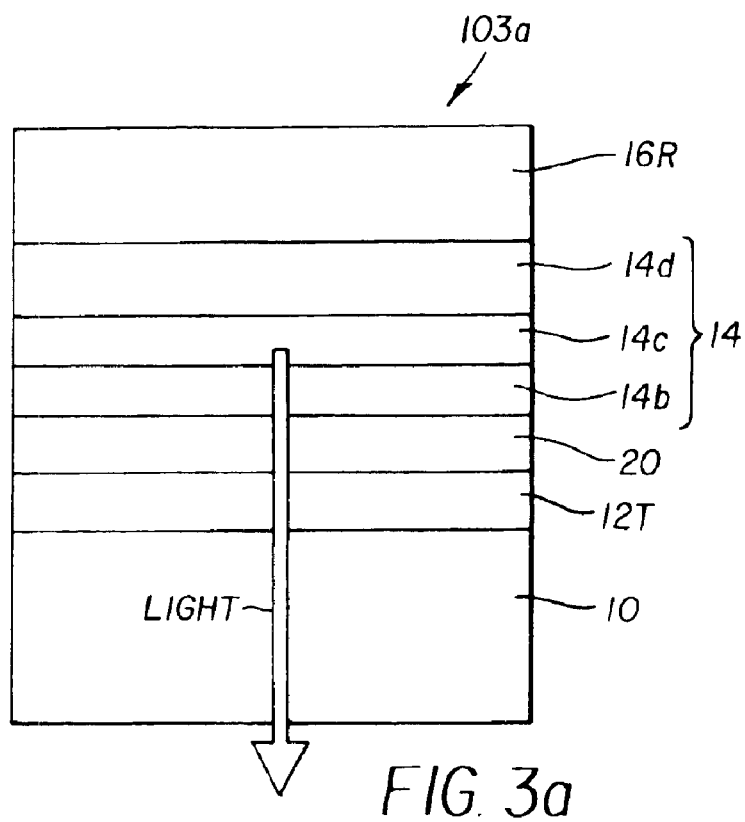
FIG. 3A is a schematic cross-sectional view of a bottom-emitting microcavity OLED device according to the present invention using all Ag electrodes.

FIG. 3A illustrates schematically the cross-sectional view of a microcavity OLED device 103a according to the present invention. Microcavity OLED device 103a includes a substrate 10, a light transmissive metallic bottom-electrode 12T, a transparent conductive phase-layer 20, an organic EL medium structure 14, and a reflective metallic top-electrode 16R. Not shown in FIG. 3a are other possible features such as a TFT circuit structure that could exist on substrate 10 underneath light transmissive metallic bottom-electrode 12T and protective overcoat or encapsulation structures that could exist over the reflective metallic top-electrode 16R. The two metallic electrodes function as the reflective mirrors of the microcavity. Since the generated light emits through the light transmissive metallic bottom-electrode 12T and the substrate, substrate 10 needs to be transparent, and can be selected from glass or plastic. The reflective metallic top-electrode 16R is selected from Ag, Au, Al or alloys thereof, and the light transmissive metallic bottom-electrode 12T is selected from Ag, Au, or alloys thereof. The thickness of the reflective metallic top-electrode 16R is selected to have an optical density of 1.5 or larger so that it is substantially opaque and reflective. The thickness of the light transmissive bottom-electrode 12T is selected to improve the luminance light output at a predetermined wavelength from the microcavity OLED device 103a. The preferred thickness depends on the materials selected to be the anode and the cathode. The organic EL medium structure includes at least a light-emitting layer 14c, and may include one or more additional layer such as hole-injecting layer 14a (not shown), hole-transporting layer 14b, electron-transporting layer 14d, and electron-injecting layer 14e (not shown). In the order shown in FIG. 3A the light transmissive metallic bottom-electrode 12T is the anode and the reflective metallic top-electrode 16R is the cathode. The use of the transparent conductive phase-layer 20 is optional. If a transparent conductive phase-layer 20 is used, the combined thickness of transparent conductive phase-layer 20 and organic EL medium structure 14 is selected to tune the microcavity OLED device 103a to have the resonance at the predetermined wavelength to be emitted from the device. For example, such predetermined wavelength can correspond to a center-wavelength of one of emitted red, green, or blue light from the microcavity OLED device constructed in accordance with the present invention. The thickness satisfies the following equation:

$$2 \Sigma n_i L_i + 2 n_s L_s + (Q_{m1} + Q_{m2}) \lambda/2\pi = m\lambda \qquad \text{Equation 1,}$$

wherein $n_i$ is the index of refraction and $L_i$ is the thickness of the ith sublayer in organic EL medium structure 14; $n_s$ is the index of refraction and $L_s$ is the thickness, which can be zero, of transparent conductive phase-layer 20; $Q_{m1}$ and $Q_{m2}$ are the phase shifts in radians at the two organic EL medium structure metal electrode interfaces, respectively; $\lambda$ is the predetermined wavelength to be emitted from the device, and m is a non-negative integer. For ease of manufacturing considerations and for color purity, it is preferred to have m equal to 1 for the blue pixels, 0 or 1 for the green and red pixels.

The total thickness between the metal electrodes is the most important factor in determining the microcavity resonance wavelength. However, the resonance wavelength and more particularly the strength of the resonance (and thus the resulting efficiency of the device) also depend on the distance between the light-emitting layer 14c and each of the two electrodes. In particular, for optimal device performance, the distance between the reflective metallic top-electrode 16R and (the center of) the light-emitting layer 14c should roughly satisfy the following equation:

$$2\Sigma n_i L_i + Q_{m1} \lambda/2\pi = m_D \lambda \qquad \text{Equation 2,}$$

wherein $n_i$ is the index of refraction and $L_i$ is the thickness of the ith sublayer in organic EL medium structure 14, $Q_{m1}$ is the phase shift in radians at the organic EL medium structure metal cathode interface, $\lambda$ is the predetermined wavelength to be emitted from the device, and $m_D$ a non-negative integer. Note that, in contrast to Equation 1, the sum here is only over those layers that lie between (the center of) the emitting layer and the reflective metallic top-electrode 16R. One could write an analogous equation for the distance between the light transmissive metallic bottom-electrode 12T and the light-emitting layer 14c. However, since satisfaction of Equations 1 and 2 guarantee the satisfaction of this third equation, it does not provide any additional constraint.

Since it is desirable that the absorption of light by the light transmissive metallic bottom-electrode 12T be as low as feasible, a useful addition (that will be illustrated further in the examples below) is a high index of refraction absorption-reducing layer 22 between the light transmissive metallic bottom-electrode 12T and substrate 10. The purpose of this absorption-reducing layer 22 is to reduce the electric field produced by the light wave (and thus the absorption of the light wave) within the light transmissive metallic bottom-electrode 12T itself. To a good approximation, this result is best accomplished by having the electric field of the light wave reflected back from the interface between this absorption-reducing layer 22 and substrate 10 interfere destructively with, and thus partly cancel, the electric field of the light passing out of the device. Elementary optical considerations then imply that this will occur (for an absorption-reducing layer 22 having a higher index of refraction than the substrate 10) when the following equation is approximately satisfied:

$$2n_A L_A + n_T L_T = (m_A + \tfrac{1}{2}) \lambda \qquad \text{Equation 3,}$$

where $n_A$ and $L_A$ are the index of refraction and the thickness of absorption-reducing layer 22 respectively, $n_T$ and $L_T$ are the real part of the index of refraction and the thickness of light transmissive metallic bottom-electrode 12T respectively, and $m_A$ is a non-negative integer. It is preferred to have $m_A$ as small as practical, usually 0 and typically less than 2. The beneficial effects of the absorption-reducing layer are generally higher when higher index of refraction materials are used. For practical applications, an index of refraction value of 1.6 or higher is preferred.

In an alternate configuration of the device, the light transmissive metallic bottom-electrode 12T can be the cathode and the reflective metallic top-electrode 16R can be the anode. In such a case the organic EL medium structure 14 is appropriately orientated so that the hole-injecting and hole-transporting layers are closer to the anode and the electron-injecting and electron-transporting layers are closer to the cathode.

Whereas the above discussions are based on a bottom-emitting OLED device, similar considerations and equations, with proper modifications, apply to a top-emitting device as well.

The effectiveness of the present invention in utilizing the all-metallic microcavity to enhance the OLED device output is illustrated in the following examples. In the examples based on theoretical prediction, the electroluminescence (EL) spectrum produced by a given device is predicted using an optical model that solves Maxwell's Equations for emitting dipoles of random orientation in a planar multilayer device (O. H. Crawford, J. Chem. Phys. 89, p6017, 1988; K. B. Kahen, Appl. Phys. Lett. 78, p1649, 2001). The dipole emission spectrum is assumed to be independent of wavelength in many cases so that the microcavity property itself can be investigated. In other cases the dipole emission spectrum is assumed to be given by the measured photoluminescence (PL) spectrum of the emitter material, incorporating a small blue shift of a few nanometers. This emission is assumed to occur uniformly in the first 10 nm of the emitting-layer bordering the hole-transporting layer. For each layer, the model uses wavelength-dependent complex refractive indices that are either measured by spectroscopic ellipsometry or taken from the literature (Handbook of Optical Constants of Solids, ed. by E. D. Palik, Academic Press, 1985; Handbook of Optical Constants of Solids II, ed. by E. D. Palik, Academic Press, 1991; CRC Handbook of Chemistry and Physics, 83rd ed., edited by D. R. Lide, CRC Press, Boca Raton, 2002). Once the EL spectrum has been derived, it is straightforward to compute the luminance (up to a constant factor) and the CIE chromaticities of this spectrum. Numerous comparisons between predicted EL spectra and measured EL spectra have confirmed that the model predictions are very accurate. For all the theoretical examples, the total luminance output integrated over the entire visible wavelength region from 340 nm to 780 nm is used as a figure-of-merit to compare different device configurations. This luminance value is a convenient and reliable proxy of the emission output efficiency value that the present invention is aiming at improving. The luminance value actually underestimates the benefit of the microcavity as it includes the contribution of light outside of the wavelength region of interest. This extra light constitutes a larger fraction of the output of a non-microcavity device versus a microcavity device because of the larger emission bandwidth for the non-microcavity device.

EXAMPLE 1

Example 1 compares the theoretically predicted luminance output of a bottom-emitting microcavity OLED device 103a as shown in FIG. 3A in accordance with the present invention against two comparative devices:

a) an OLED device 103b without a microcavity, and b) a microcavity OLED device 103c using a QWS as one of the mirrors for the microcavity.

Figure 3B:
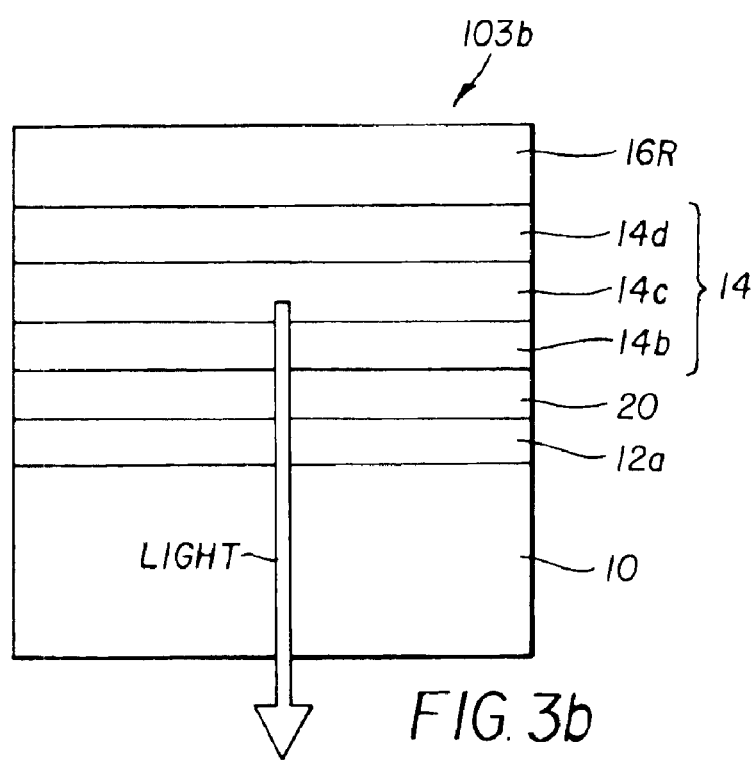
FIG. 3B is a schematic cross-sectional view of a bottom-emitting OLED device without microcavity.

OLED device 103b shown in FIG. 3b was similar in construction to microcavity OLED device 103a except that the light transmissive metallic bottom-electrode 12T which was an Ag anode was replaced by an ITO transparent bottom-electrode 12a. This device represents an OLED device without microcavity, although there is always some optical interference effect in a multi-layer device.

Figure 3C:
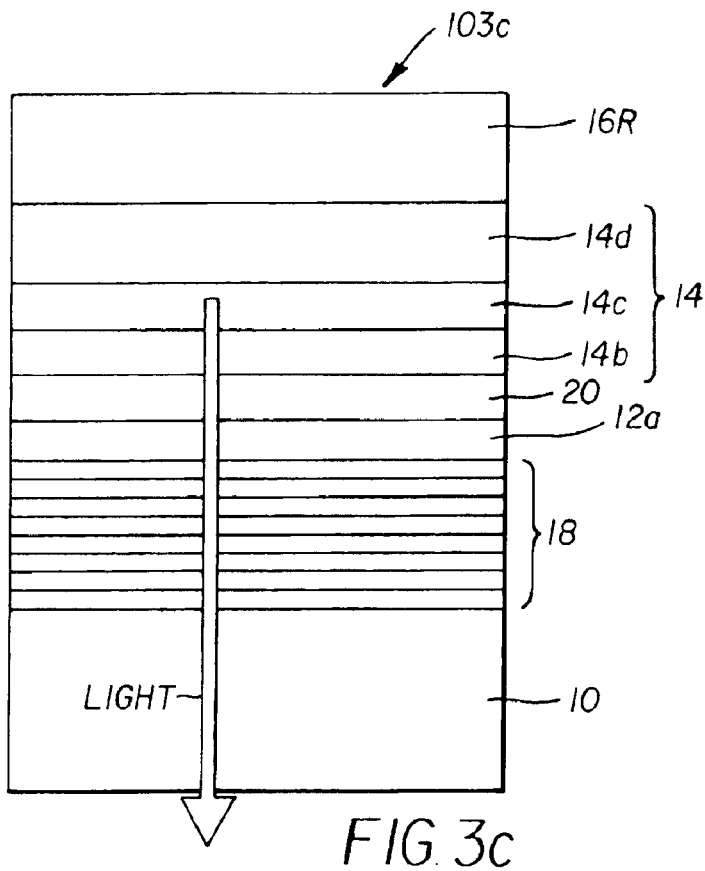
FIG. 3C is a schematic cross-sectional view of a prior art microcavity OLED device based on a QWS.

Microcavity OLED device 103c shown in FIG. 3c was similar in construction to OLED device 103b except that a QWS reflecting mirror 18 was disposed between substrate 10 and ITO transparent bottom-electrode 12a. The QWS reflecting mirror 18 was of the form $TiO_2:SiO_2:TiO_2:SiO_2:TiO_2$ with $TiO_2$ n=2.45 and $SiO_2$ n=1.5. The thickness of each material was 56 nm for $TiO_2$ and 92 nm for $SiO_2$ (as in R. H. Jordan et al., Appl. Phys. Lett. 69, p1997, 1996). This device represents a typical QWS based microcavity OLED device.

For all three devices, substrate 10 was glass. Reflective metallic top-electrode 16R was a 400 nm Ag layer. The organic EL medium structure 14 was assumed to include a NPB hole-transporting layer 14b, a 10 nm light-emitting layer 14c, and an Alq electron-transporting layer 14d. The light-emitting layer 14c was assumed to have an output that is independent of wavelength. This assumption was to facilitate the evaluation of the microcavity property itself independent of the specific properties of the emitter so that the conclusion can be applied generically to any emitters. The use of a wavelength-independent emitter, however, under-estimates the beneficial effect of the microcavity. The thickness of the transparent conductive phase-layer 20 was assumed to be zero for all three devices. The thickness of all the layers was optimized to achieve maximum luminance output from each device. The luminance output was integrated over the entire visible wavelength range from 380 nm to 780 nm.

The calculated results are summarized in Table 1. These results showed that microcavity OLED device 103c using a QWS as a light transmissive mirror indeed enhanced the luminance output and narrowed the emission bandwidth (full-width-half-max FWHM) when compared with the OLED device 103b without microcavity. The luminance value improved from 0.239 (arbitrary units) to 0.385. Microcavity OLED device 103a using all Ag mirrors, however, showed surprisingly better luminance output, 0.425, even though the peak luminance height was more than a factor of two lower than that of microcavity OLED device 103c. The emission bandwidth of the all-Ag microcavity OLED device 103a was much larger than OLED device 103c with a QWS, but it was still small enough to yield good color purity or chromaticity.

TABLE 1

| Device | Description | Substrate | QWS | Anode (ITO) nm | Anode (Ag) nm | NPB nm | Flat Band Emitter nm | Alq nm | Cathode (Ag) nm | Luminance arbitrary | Peak location nm | height arbitrary | FWHM nm |
|---|---|---|---|---|---|---|---|---|---|---|---|---|---|
| 103b | no cavity | Glass | | 100.7 | | 43.1 | 10 | 53.1 | 400 | 0.239 | 547 | 2.4 | N.A. |
| 103c | QWS | Glass | yes | 50.0 | | 26.6 | 10 | 54.9 | 400 | 0.385 | 564 | 16.8 | 17 |
| 103a | all Ag | Glass | | | 17.5 | 45.9 | 10 | 54.3 | 400 | 0.425 | 567 | 6.6 | 73 |

EXAMPLE 2

Example 2 is a demonstration of the benefit of the absorption-reducing layer 22 for a bottom-emitting device.

Figure 3D:
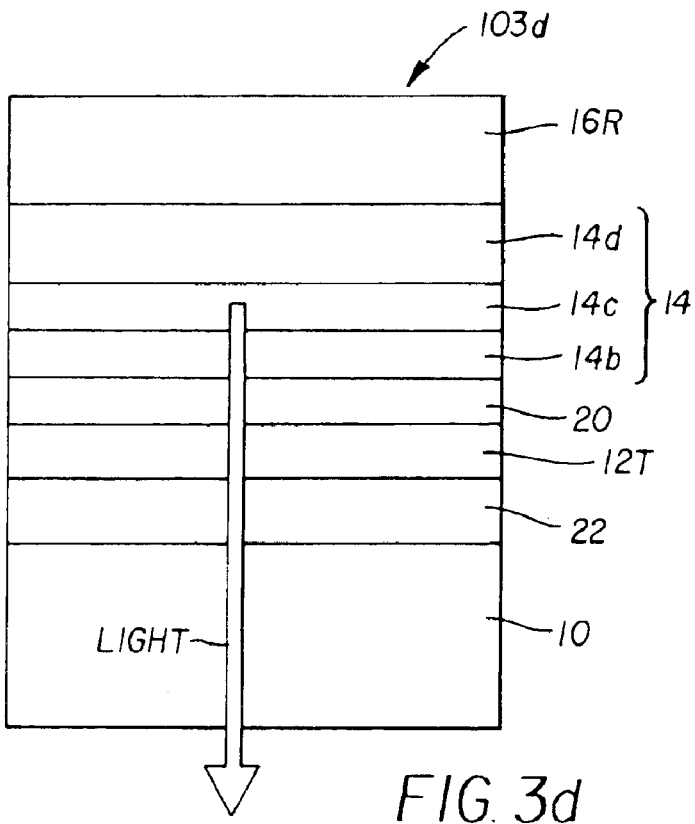
FIG. 3D is a schematic cross-sectional view of a bottom-emitting microcavity OLED with an absorption-reducing layer according to the present invention.

FIG. 3D illustrates schematically the cross-sectional view of a bottom-emitting microcavity OLED device 103d. Microcavity OLED device 103d was similar in structure to microcavity OLED device 103a except an absorption-reducing layer 22 was disposed between substrate 10 and light transmissive metallic bottom-electrode 12T. For this example, ITO was selected as the absorption-reducing layer 22. Our calculations showed that the effectiveness of the absorption-reducing layer 22 in enhancing luminance output would improve if a higher index of refraction material were used. As will be apparent from Example 4, luminance output could also be increased if the absorption-reducing layer 22 were in direct contact with air rather than with glass. The thickness of all layers was optimized as in Example 1. The results of the calculation are summarized in Table 2. It can be seen that the insertion of absorption-reducing layer 22 increased the luminance output of the all Ag microcavity OLED device 103a from about 0.425 to about 0.453.

was only one reflecting mirror in the device, OLED device 104b represents an OLED device without a microcavity, although there is always some optical interference effect in a multi-layer device, particularly at the interface between the ITO cathode and the air.

Figure 4A:
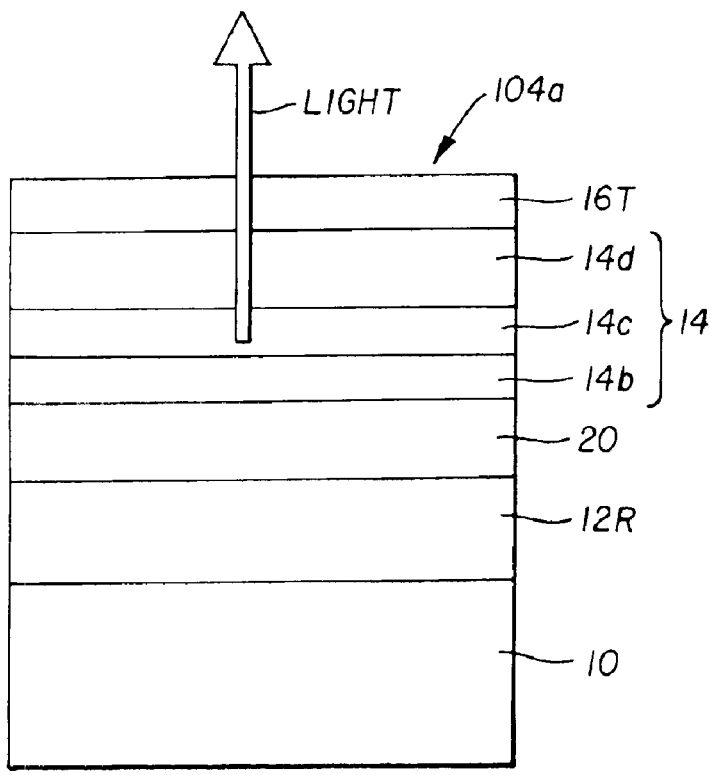
FIG. 4A is a schematic cross-sectional view of a top-emitting microcavity OLED device according to the present invention using all Ag electrodes.
Figure 4B:
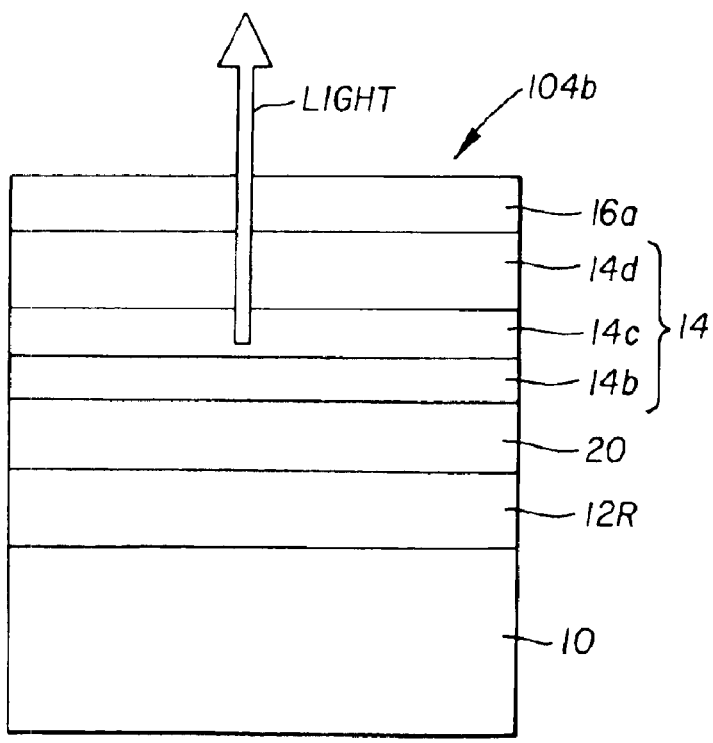
FIG. 4B is a schematic cross-sectional view of a top-emitting OLED device without microcavity.
Figure 4C:
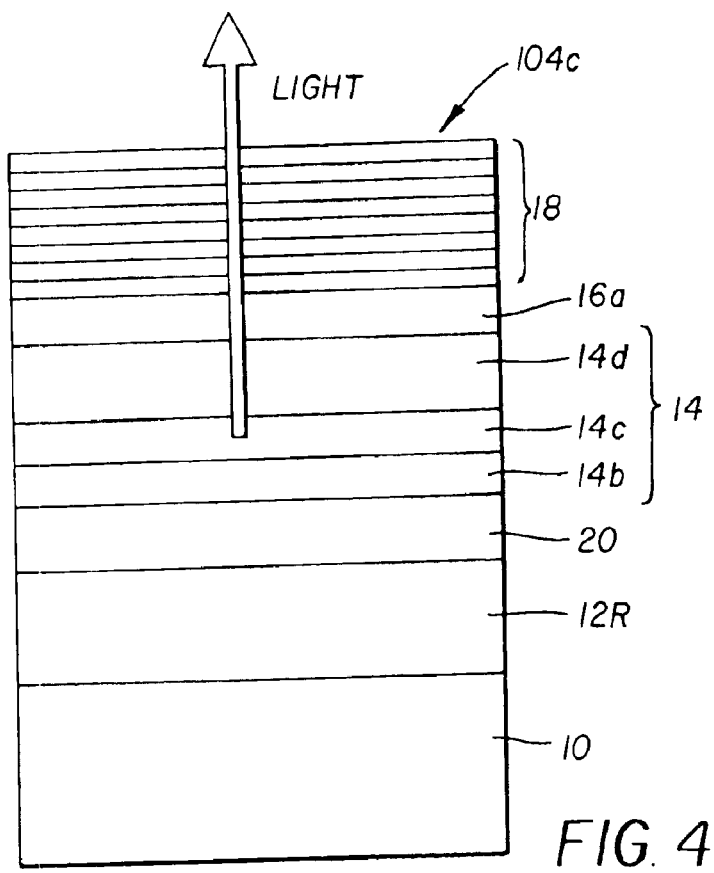
FIG. 4C is a schematic cross-sectional view of a top-emitting microcavity OLED device based on a QWS.

OLED device 104c shown in FIG. 4c was similar in construction to OLED device 104b except that a QWS reflecting mirror 18 was disposed on top of transparent top-electrode 16a which we required to have a thickness of at least 50 nm. The QWS reflecting mirror 18 was of the form $TiO_2:SiO_2:TiO_2:SiO_2:TiO_2$ with $TiO_2$ n=2.45 and $SiO_2$ n=1.5. Thickness of each materials is 56 nm for $TiO_2$ and 92 nm for $SiO_2$ (as in R. H. Jordan et al., Appl. Phys. Lett. 69, p1997, 1996). This device represents a typical QWS based microcavity OLED device.

For all three devices the reflective metallic bottom-electrode 12R was a 400 nm Ag layer. The organic EL medium structure 14 was assumed to include a NPB hole-transporting layer 14b, a 10 nm light-emitting layer 14c, and

TABLE 2

| Device | Description | Substrate | Absorption-reducing (ITO) nm | Anode (Ag) nm | NPB nm | Flat Band Emitter nm | Alq nm | Cathode (Ag) nm | Luminance arbitrary | Peak Location nm | Height arbitrary | FWHM nm |
|---|---|---|---|---|---|---|---|---|---|---|---|---|
| 103a | Without absorption-reducing | Glass | | 17.5 | 45.9 | 10 | 54.3 | 400 | 0.425 | 567 | 6.6 | 73 |
| 103d | With absorption-reducing | Glass | 82.2 | 18.5 | 48.1 | 10 | 54.3 | 400 | 0.453 | 565 | 7.0 | 75 |

EXAMPLE 3

Example 3 compares the theoretically predicted luminance output of a top-emitting microcavity OLED device 104a in accordance with the present invention against two comparative devices:

a) an OLED device 104b without a microcavity, b) a microcavity OLED device 104c using a QWS as one of the reflecting mirrors for the microcavity.

FIG. 4A illustrates schematically the cross-sectional view of an exemplary top-emitting microcavity OLED device 104a according to the present invention. Microcavity OLED device 104a included a glass substrate 10, a Ag reflective metallic bottom-electrode 12R, a transparent conductive phase-layer 20, an organic EL medium structure 14, and an Ag light transmissive metallic top-electrode 16T.

OLED device 104b shown in FIG. 4b was similar in construction to microcavity OLED device 104a except that the Ag light transmissive metallic top-electrode 16T was replaced by an ITO transparent top-electrode 16a which we required to have a thickness of at least 50 nm. Because there an Alq electron-transporting layer 14d. The light-emitting layer was assumed to have an output that was independent of wavelength. This assumption is to facilitate the evaluation of the microcavity property itself independent of the specific properties of emitter so that the conclusion can be applied generically to any emitters. The transparent conductive phase-layer 20 was made of ITO. The thickness of all the layers was optimized to achieve maximum luminance output from each device. The luminance output was integrated over the entire visible wavelength range from 380 nm to 780 nm.

TABLE 3

| Device | Anode Ag nm | ITO nm | NPB nm | Flat Band Emitter nm | Alq nm | cathode material | Cathode nm | Luminance Arbitrary | Peak Location nm | Peak Ht. Arbitrary | FWHM nm |
|---|---|---|---|---|---|---|---|---|---|---|---|
| 104b | 400 | 19.7 | 30 | 10 | 67.0 | ITO | 86.8 | 0.318 | 555 | 3.8 | 141 |
| 104c | 400 | 23.1 | 30 | 10 | 29.8 | ITO + QWS | 50 | 0.335 | 568 | 19.4 | 13 |
| 104a | 400 | 20.2 | 30 | 10 | 44.6 | Ag | 13.7 | 0.411 | 568 | 6.2 | 75 |

Table 3 shows the calculated characteristics of the three devices. Microcavity OLED device 104c using a QWS as one of its reflecting mirrors did show a very strong microcavity effect. The luminance peak height was greatly increased to 19.4 (arbitrary units) as compared with a value of 3.8 for OLED device 104b without microcavity. Because of the much narrowed FWHM, however, the total luminance output was actually only modestly larger. If the minimum thickness of the ITO cathode were set to a larger value than 50 nm (say, 100 nm) in order to obtain the required electrical conductivity for the cathode, then the QWS is actually found to have a lower luminance than the device without the QWS because the cavity thickness for the QWS case cannot be optimized at the lowest order maximum. Microcavity OLED device 104a using Ag for both electrodes, on the other hand, showed a significant improvement in luminance output over the other two comparative devices.

EXAMPLE 4

Figure 4D:
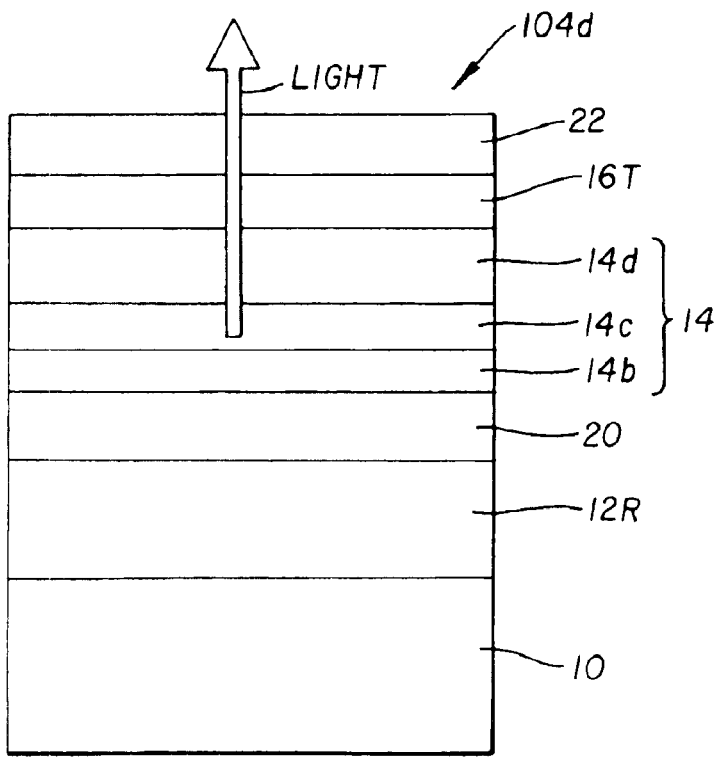
FIG. 4D is a schematic cross-sectional view of a top-emitting microcavity OLED with an absorption-reducing layer according to the present invention.

Example 4 is a demonstration of the benefit of the absorption-reducing layer. FIG. 4D illustrates schematically the cross-sectional view of a top-emitting microcavity OLED device 104d. Microcavity OLED device 104d was similar in structure to microcavity OLED device 104a except that an absorption-reducing layer 22 was disposed over the light transmissive metallic top-electrode 16T. For this example, ZnS:20% $SiO_2$ (n=2.15, k=0.003) was selected as the material for the exemplary absorption-reducing layer 22. Our calculations showed that the effectiveness of the absorption-reducing layer in enhancing luminance output would improve if a higher index of refraction material were used. The thickness of all layers was optimized as in Example 1. The results of the calculation are summarized in Table 4. It can be seen that the insertion of absorption-reducing layer 22 increased the luminance output of the microcavity OLED device from about 0.411 to about 0.504. In addition, the thickness of the optimum light transmissive Ag cathode layer is increased from 13.7 nm to 20.3 nm. The increased Ag thickness is beneficial since it increases greatly the electrical conductivity of the light transmissive electrode layer.

the light transmissive metallic top-electrode 16T was a thin Ag layer. The organic EL medium structure 14 was assumed to include a NPB hole-transporting layer 14b, a 10 nm light-emitting layer 14c, and an Alq electron-transporting layer 14d. The light emitting-layer 14c was assumed to have an output that was independent of wavelength. This assumption is to facilitate the evaluation of the microcavity property itself independent of the specific properties of emitter so that the conclusion can be applied generically to any emitters. An ITO layer was used as the transparent conductive phase-layer 20 and a ZnS:(20%)$SiO_2$ dielectric was used as the absorption-reducing layer 22. The thickness of all layers, except that of the NPB hole-transporting layer 14b, was optimized to give maximum luminance output. The thickness of the hole-transporting layer 14b was fixed at 30 nm for all devices.

TABLE 5

| Anode | ITO nm | NPB nm | Emitter nm | Alq nm | cathode material | cathode nm | ZnS:SiO2 nm | Luminance Arbitrary | Peak λ nm | Peak Ht. Arbitrary | FWHM nm |
|---|---|---|---|---|---|---|---|---|---|---|---|
| Ag | 19.6 | 30 | 10 | 58.3 | Ag | 20.3 | 61.4 | 0.504 | 560 | 9.0 | 58 |
| Al | 29.4 | 30 | 10 | 58.0 | Ag | 19.7 | 60.8 | 0.481 | 558 | 8.0 | 63 |
| Au | 16.2 | 30 | 10 | 60.8 | Ag | 19.0 | 63.8 | 0.435 | 558 | 7.7 | 70 |
| MgAg | 23.7 | 30 | 10 | 56.1 | Ag | 15.7 | 65.8 | 0.429 | 558 | 6.7 | 72 |
| Cu | 16.5 | 30 | 10 | 63.5 | Ag | 14.5 | 62.3 | 0.310 | 593 | 4.9 | 96 |
| Cr | 29.2 | 30 | 10 | 62.7 | Ag | 10.0 | 60.6 | 0.239 | 555 | 2.8 | 160 |
| Mo | 29.8 | 30 | 10 | 71.8 | Ag | 0 | 71.3 | 0.199 | 565 | 2.2 | 186 |
| Zr | 7.9 | 30 | 10 | 10.0 | Ag | 0 | 0 | 0.096 | 588 | 0.9 | N.A. |

Table 5 shows the calculated characteristics of devices made using different reflective anode materials. The selection of anode material had a drastic effect on the luminance efficiency of the devices. There appears to be a direct correlation between the reflectivity of the anode material and the luminance output. There was over a factor of five difference in luminance output between the lowest reflectivity Zr anode and the highest reflectivity Ag anode. For the lowest reflectivity anodes such as Mo or Zr, the optimum luminance was obtained when there was no light transmissive cathode. The FWHM was very large and there was little luminance enhancement over the non-cavity baseline value of 0.318 unless higher reflectivity materials such as Ag, Al, Au and MgAg were used as the anode.

EXAMPLE 6

Example 6 demonstrates the effect of different metallic light transmissive electrode materials on device performance.

TABLE 4

| Device | Anode Ag | ITO nm | NPB nm | Alq nm | cathode material | cathode nm | ZnS:$SiO_2$ nm | Luminance Arbitrary | Peak Location nm | Peak Ht. Arbitrary | FWHM nm |
|---|---|---|---|---|---|---|---|---|---|---|---|
| 104a | 400 | 20.2 | 30 | 44.6 | Ag | 13.7 | 0 | 0.411 | 568 | 6.2 | 75 |
| 104d | 400 | 19.6 | 30 | 58.3 | Ag | 20.3 | 61.4 | 0.504 | 560 | 9.0 | 58 |

EXAMPLE 5

Example 5 compares different materials for use as the reflective metallic electrode layer.

Table 5 shows the calculated luminance output of devices made according to FIG. 4D but using different materials for the reflective metallic bottom-electrode 12R. For all devices Table 6a shows the calculated luminance output of devices made according to FIG. 4A but using different materials for the light transmissive metallic top-electrode 16T, which was the cathode for the devices. For all devices the reflective metallic bottom-electrode 12R was a 400 nm Ag layer. The organic EL medium structure 14 was assumed to include a NPB hole-transporting layer 14b, a 10 nm light-emitting layer 14c, and an Alq electron-transporting layer 14d. The light-emitting layer was assumed to have an output that was independent of wavelength. This assumption is to facilitate the evaluation of the microcavity property itself independent of the specific properties of emitter so that the conclusion can be applied generically to any emitters. An ITO layer was used as the transparent conductive phase-layer 20 and no absorption-reducing layer 22 was used. The thickness of all layers, except that of the NPB hole-transporting layer 14*b*, was optimized to give maximum luminance output. The thickness of the hole-transporting layer 14*b* was fixed at 30 nm for all devices and the thickness of electron-transporting layer 14*d* was restricted to be 20 nm or larger. Without the latter restriction the optimization algorithm selects an unrealistically small thickness for the electron-transporting layer.

assumed to have an output that was independent of wavelength. This assumption is to facilitate the evaluation of the microcavity property itself independent of the specific properties of emitter so that the conclusion can be applied generically to any emitters. An ITO layer was used as the transparent conductive phase-layer 20 and a $ZnS:(20\%)SiO_2$ dielectric layer was used as the absorption-reducing layer 22. The thickness of all layers, except that of the NPB hole-transporting layer 14*b*, was optimized to give maximum luminance output. The thickness of the hole-transporting layer 14*b* was fixed at 30 nm for all devices. The MgAg alloy was a 90% Mg: 10% Ag alloy commonly used for OLED applications. It is expected that other MgAg alloys with less than 50% Ag will show similar behavior.

TABLE 6a

| Anode | ITO transparent conductive phase-layer nm | NPB Thicknes nm | Emitter Thickness nm | Alq Thickness nm | Cathode | Cathode Thickness nm | Luminance a. u. | Peak Wavelength nm | Peak Height a. u. | FWHM nm |
|---|---|---|---|---|---|---|---|---|---|---|
| Ag | 20.2 | 30 | 10 | 44.6 | Ag | 13.7 | 0.411 | 567.5 | 6.2 | 75 |
| Ag | 21.5 | 30 | 10 | 44.5 | Au | 21.3 | 0.385 | 582.5 | 5.9 | 94 |
| Ag | 11.4 | 30 | 10 | 20.0 | MgAg | 0 | 0.345 | 567.5 | 3.4 | N.A. |
| Ag | 11.4 | 30 | 10 | 20.0 | Al | 0 | 0.345 | 567.5 | 3.4 | N.A. |
| Ag | 11.4 | 30 | 10 | 20.0 | Cu | 0 | 0.345 | 567.5 | 3.4 | N.A. |
| Ag | 11.4 | 30 | 10 | 20.0 | Cr | 0 | 0.345 | 567.5 | 3.4 | N.A. |
| Ag | 11.4 | 30 | 10 | 20.0 | Mo | 0 | 0.345 | 567.5 | 3.4 | N.A. |
| Ag | 11.4 | 30 | 10 | 20.0 | Zr | 0 | 0.345 | 567.5 | 3.4 | N.A. |

Table 6a shows that the selection of material for the light transmissive metallic top-electrode 16T had a significant impact on device performance. Only devices using Au and Ag as the light transmissive metallic top-electrode 16T showed microcavity enhancement effect. Using all other materials as cathode, the optimum performance was obtained when no cathode thickness was used. Of course this not a realistic case since a cathode is needed to complete the cell.

TABLE 6b

| Anode | ITO nm | NPB nm | Emitter nm | Alq nm | cathode material | cathode nm | ZnS:SiO2 nm | Luminance Arbitrary | Peak □ nm | Peak Ht. Arbitrary | FWHM nm |
|---|---|---|---|---|---|---|---|---|---|---|---|
| Ag | 19.6 | 30 | 10 | 58.3 | Ag | 20.3 | 61.4 | 0.504 | 560 | 9 | 58 |
| Ag | 19.9 | 30 | 10 | 56.5 | Au | 21.5 | 62.7 | 0.486 | 565 | 8.3 | 62 |
| Ag | 20.4 | 30 | 10 | 60.1 | MgAg | 12.3 | 67.2 | 0.470 | 558 | 7.3 | 66 |
| Ag | 19.5 | 30 | 10 | 65.0 | Al | 5.5 | 69.1 | 0.440 | 558 | 7.3 | 63 |
| Ag | 18.9 | 30 | 10 | 63.8 | Cu | 14.7 | 64.0 | 0.418 | 565 | 5.9 | 95 |
| Ag | 19.6 | 30 | 10 | 77.3 | Cr | 0 | 64.9 | 0.396 | 560 | 5.3 | 101 |
| Ag | 19.6 | 30 | 10 | 77.3 | Mo | 0 | 64.9 | 0.396 | 560 | 5.3 | 101 |
| Ag | 19.6 | 30 | 10 | 77.3 | Zr | 0 | 64.9 | 0.396 | 560 | 5.3 | 101 |
| Ag | 23.1 | 30 | 10 | 29.8 | ITO + QWS | 50.0 |  | 0.335 | 568 | 19.4 | 13 |

When an absorption-reducing layer is used, more materials can be used as the light transmissive metallic top-electrode 16T. Table 6b shows the calculated luminance output of devices made similar to those for Table 6a, but with an absorption-reducing layer 22 of $ZnS:(20\%)SiO_2$ added over the light transmissive metallic top-electrode 16T. For all devices the reflective metallic bottom-electrode 12R was a 400 nm Ag layer. The organic EL medium structure 14 was assumed to include a NPB hole-transporting layer 14*b*, a 10 nm light-emitting layer 14*c*, and an Alq electron-transporting layer 14*d*. The light-emitting layer 14*c* was Table 6b shows that the selection of material for the light transmissive metallic top-electrode 16T broadens with the presence of the absorption-reducing layer. Materials include Al, Cu, alloys thereof, or MgAg alloys with less than 50% Ag can be used to produce the beneficial microcavity effect. Again the higher reflectivity metals such as Ag, Au, MgAg, and Al showed the best results, but the correlation with reflectivity is not as strong since the higher reflectivity Al gave worse results than Au and MgAg. (This is understood to be due to the fact that the optical absorbance of the metal is also an important parameter for the light transmissive electrode. Al has a particularly large imaginary part of its index of refraction and thus a high absorbance.) Also included in the study was a microcavity OLED device using a QWS as the light transmissive mirror. It actually yielded lower total luminance than all other materials investigated. The peak height was significantly higher than all other materials, but because of its extremely small FWHM, the luminance output was the smallest.

As described above, the light-emitting layer 14c can include an organic hole-transporting host material or a mixture of hole-transporting host materials. Alternatively, the light emitting layer can include an organic electron-transporting host material or a mixture of electron-transporting host materials. Dispersed within such host material(s) is one or more dopants selected to generate, for example, red light, green light, or blue light in the light-emitting layer. In the microcavity OLED device of the present invention, the thickness of all layers disposed between the two metallic electrode layers (12R, 12T, 16R, 16T) is selected to provide a resonance condition within the microcavity for a particular range of wavelengths of light generated within the light emitting layer 14c. If m=1 is chosen in Equation 1, the total thickness of all layers disposed between the two metallic electrode layers is approximately 270 nm to achieve a cavity resonance condition for red-light emission from the microcavity device. Total thickness of all layers is approximately 250 nm for green-light emission, and approximately 200 nm for blue-light emission through the light transmissive metallic electrode layer (12T, 16T). By tuning the thickness of one or more layers disposed between the metallic electrode layers, a resonance condition of the microcavity is tuned to provide an improved luminance efficiency and an improved chromaticity of one of red, green, or blue light emitted from an operative microcavity OLED device through the light transmissive metallic electrode layer.

Figure 5:
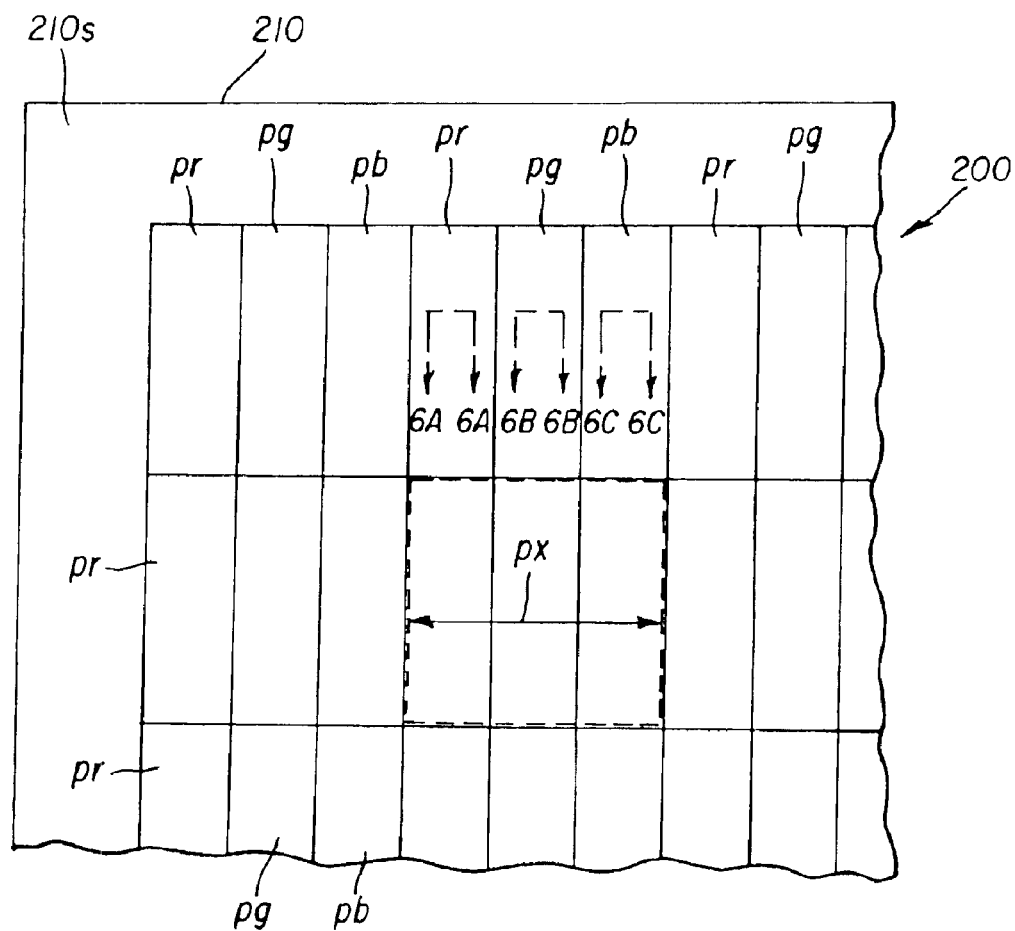
FIG. 5 is a schematic plan view of a top-emitting full-color microcavity OLED device according to the present invention.

FIG. 5 is a schematic plan view of a top-emitting full-color microcavity OLED display device 200 constructed over a substrate surface 210s of a substrate 210. The device 200 includes blue-light emitting subpixels pb, green-light emitting subpixels pg, and red-light emitting subpixels pr arranged in a pattern. A pixel px is shown in dashed outline and is comprised of the three primary color subpixels pb, pg, and pr.

Figure 6A:
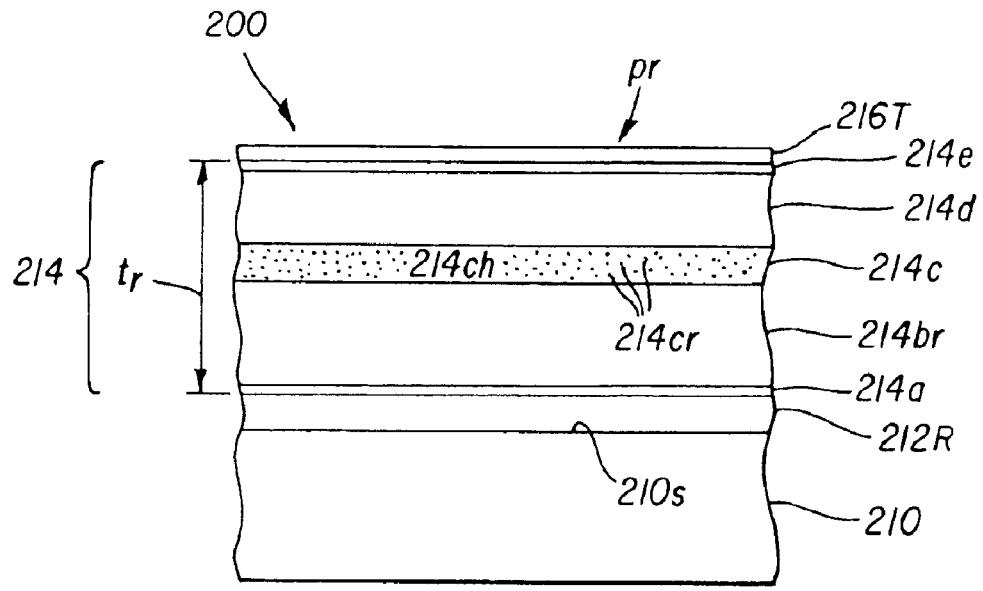
FIG. 6A is a schematic sectional view of a portion of a red-light emitting subpixel.
Figure 6B:
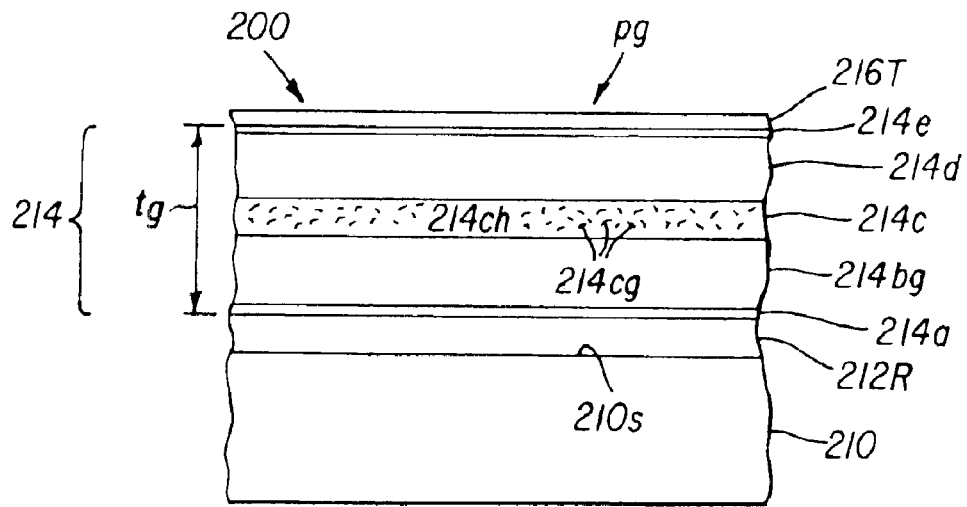
FIG. 6B is a schematic sectional view of a portion of a green-light emitting subpixel.
Figure 6C:
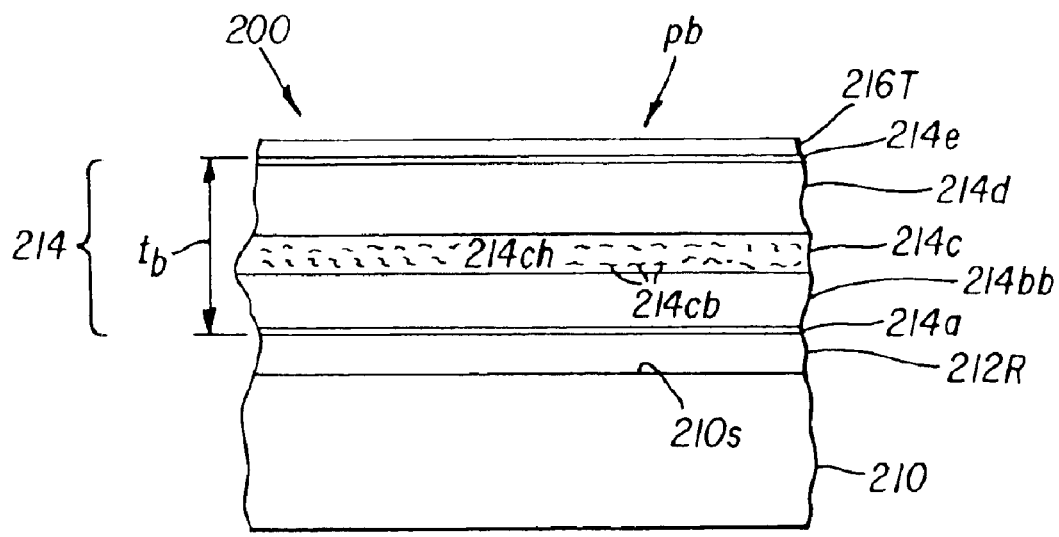
FIG. 6C is a schematic sectional view of a portion of a blue-light emitting subpixel.

FIGS. 6A–6C are schematic sectional views of portions of, respectively, a subpixel pr, a subpixel pg, and a subpixel pb, taken along respectively corresponding section line 6A—6A, 6B—6B, and 6C—6C of the device 200 of FIG. 5. These sectional views depict, as an example, a passive-matrix full-color OLED microcavity device. It will be appreciated that an active-matrix full-color microcavity device can also be provided in accordance with the present invention.

In each of the FIGS. 6A–6C, the microcavity subpixels include a reflective metallic bottom-electrode layer 212R formed over the substrate surface 210S and, in sequence, a hole-injecting layer 214a; a hole-transporting layer 214br (FIG. 6A), 214bg (FIG. 6B), and 214bb (FIG. 6C); a light-emitting layer 214c including at least one organic host material 214ch and at least one dopant material dispersed in the host material, namely red-light emitting dopant(s) 214cr depicted in dotted outline in FIG. 6A, green-light emitting dopant(s) 214cg depicted in dashed outline in FIG. 6B, and blue-light emitting dopant(s) 214cb depicted in wavy outline in FIG. 6C; an electron-transporting layer 214d; an electron-injecting layer 214e; and a light transmissive metallic top-electrode layer 216T.

The organic EL medium structure 214 includes all layers disposed between the metallic electrodes 212R and 216T, although the hole-injecting layer 214a and the electron-injecting layer 214e can be formed of inorganic materials such as, for example molybdenum oxide (MoOx), indium-tin oxide (ITO), or a fluorocarbon material (CFX) for the hole-injecting layer, and lithium (Li), lithium fluoride (LiF), or other electron-injecting inorganic materials for the electron-injecting layer. It should be noted, however, that both the hole-injecting layer 214a and the electron-injecting layer 214e are relatively thin layers (approximately 1–3 nm in thickness) compared to thicknesses of the organic hole-transporting layer, organic light-emitting layer, and organic electron-transporting layer.

The total thickness of the EL medium structure 214 is selected to provide a resonance condition in each of the subpixel microcavities, namely pr, pg, and pb. In the non-limiting examples of FIGS. 6A–6C, this total thickness of the EL medium structure 214 is tuned by adjusting a thickness of the hole-transporting layer. Thus, in FIG. 6A, the hole-transporting layer 214br has a thickness tuned for red light to provide a total thickness tr of the EL medium structure of the red-light emitting subpixels pr. In FIG. 6B, the hole-transporting layer 214bg has a thickness tuned for green light to provide a total thickness tg of the EL medium structure of the green-light emitting subpixels pg. And in FIG. 6C, the hole-transporting layer 214bb has a thickness tuned for blue light to provide a total thickness tb of the EL medium structure of the blue-light emitting subpixels pb. Indicated only schematically in FIGS. 6A–6C, $t_r > t_g > t_b$.

It will be understood that a thickness of the electron-transporting layer 214d can be adjusted or tuned instead of, or in combination with, tuning the thickness of the hole-transporting layer. The light-emitting layer 214c has a thickness (not shown in the drawings) which contributes to the total thickness of the EL medium structure 214. The thickness of the light-emitting layer can also be tuned.

Tuning or adjusting the thickness of a hole-transporting layer and/or tuning the thickness of an electron-transporting layer and/or of a light-emitting layer for each set of subpixels pr, pg, and pb requires forming patterned layers by conventional vapor deposition through openings in a deposition mask wherein the openings are oriented and aligned with respect to the subpixels to be formed. Vapor co-deposition from at least two independently controlled vapor sources is used to concurrently deposit the organic host material(s) 214ch and the at least one blue-light emitting dopant 214cb through openings in a mask which is oriented and aligned with respect to designated locations of blue-light emitting subpixels pb. This vapor co-deposition is repeated twice to provide a pattern of green-light emitting subpixels pg, and to provide a pattern of red-light emitting subpixels pr.

Phosphorescent dopant materials and fluorescent dye dopant materials have been described above, and particular ones of red-light emitting dopants, green-light emitting dopants, and blue-light emitting dopants are provided in the Examples described hereinafter.

Figure 7:
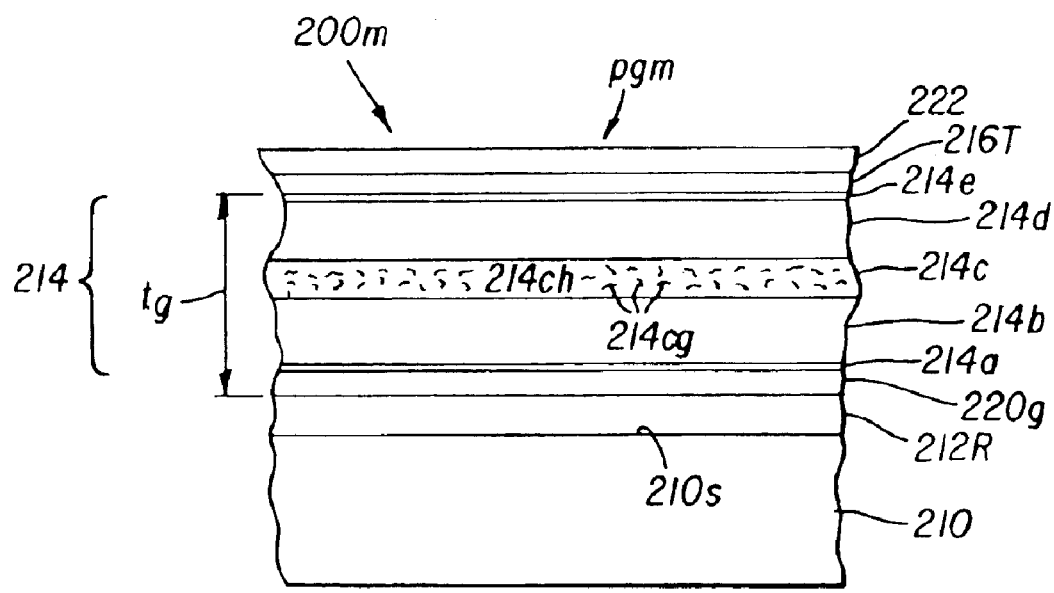
FIG. 7 is a schematic sectional view of a portion of a green-light emitting subpixel having a modified device structure including a transparent conductive phase-layer and an absorption-reducing layer.

Turning to FIG. 7, a modified green-light emitting sub-pixel pgm is shown schematically in sectional view as an illustrative example of modified subpixels of a modified top-emitting full-color microcavity OLED display device 200m.

The subpixel pgm includes two distinguishing features with respect to the green-light emitting subpixel pg described above with reference to FIG. 6B. A first distinguishing feature is a transparent and electrically conductive phase-layer 220g, which is formed over the reflective metallic bottom-electrode layer 212R. A thickness (not identified in the drawing) of the phase-layer 220g is selected so that a total thickness $t_g$ of all layers disposed between the electrode layers 212R and 216T provides a resonance condition for green light generated primarily by the dopant(s) 214cg within the light-emitting layer 214C. The hole-transporting layer 214b is no longer used for tuning the thickness $t_g$.

For a red-light emitting subpixel (not shown), a thickness of the transparent and electrically conductive phase-layer is scaled towards greater thickness to provide a resonance condition for red light. For a blue-light emitting subpixel (not shown), the phase-layer can be of zero thickness, i.e. the phase-layer is eliminated.

An advantage of using a phase-layer, constructed of inorganic materials, is that several methods can be used to provide a pattern of different phase-layer thicknesses, with the pattern oriented and aligned with respect to designated subpixel positions. For example, the phase-layer pattern can be formed by vapor deposition or by sputter deposition through openings in a deposition mask. Since no organic layers are present at this stage of device fabrication, conventional photolithographic processes can be used to deposit a phase-layer pattern through openings patterned in a photoresist layer. Alternatively, photolithographic processes can be used to patternwise etch back selected subpixel areas of a uniformly deposited phase-layer having an initial thickness corresponding to red-light emitting subpixels.

Inorganic materials suitable for providing a transparent and electrically conductive phase-layer include, but are not limited to, commonly known oxides, nitrides, and sulfides. For example indium-tin oxide (ITO), zinc-tin oxide (ZTO), tin oxide (SnOx), indium oxide (InOx), molybdenum oxide (MoOx), tellurium oxide (TeOx), antimony oxide (SbOx), and zinc oxide (ZnOx) are particularly suitable inorganic materials which can be patterned by the above patterning methods.

Another distinguishing feature of the modified subpixel pgm is an absorption-reducing layer 222 disposed over the light transmissive metallic top-electrode layer 216T outside the microcavity. The absorption-reducing layer 222 is preferably transparent and formed of a material having an index of refraction preferably greater than 1.6. A suitable material for forming the absorption-reducing layer is ZnS:20% $SiO_2$ which has a refractive index of about 2.15.

Figure 8:
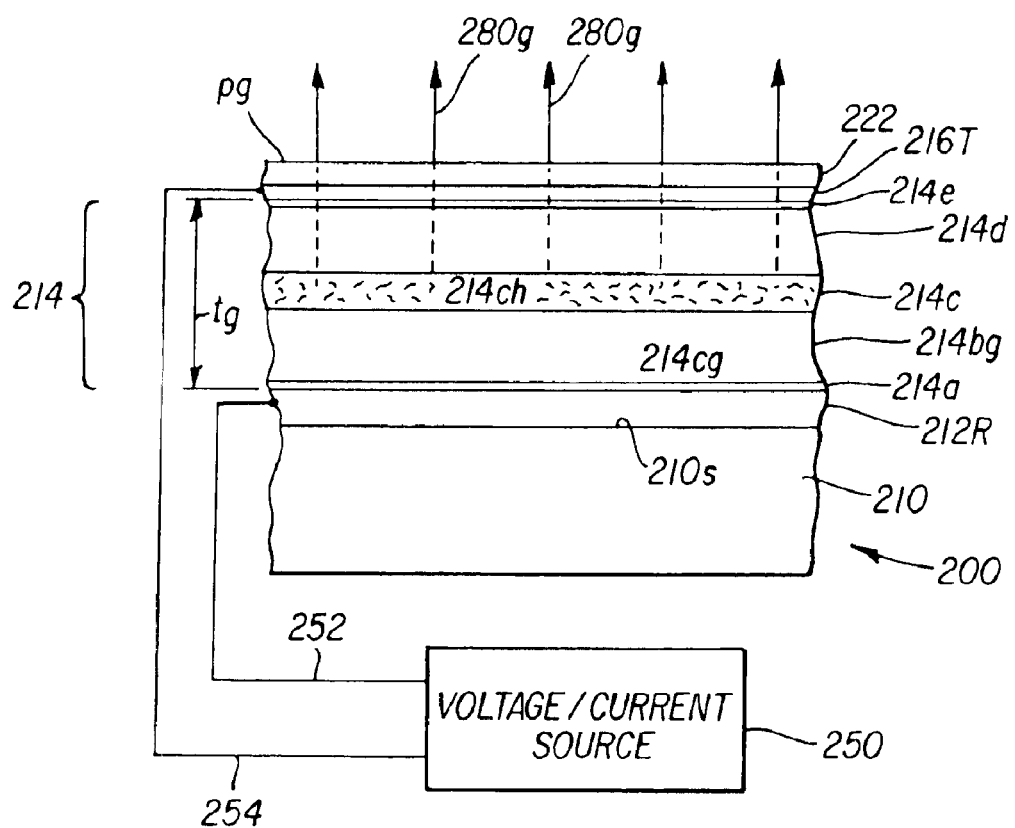
FIG. 8 is a schematic sectional view of a portion of an operative green-light emitting subpixel.

FIG. 8 is a schematic sectional view of a portion of an operative green-light emitting subpixel pg having an absorption-reducing layer 222 disposed over the light transmissive metallic top-electrode layer 216T.

An electrical power supply 250, also referred to as a voltage/current source, or as a drive current supply, is electrically connected to the reflective metallic bottom-electrode layer 212R via an electrical lead 252. Another electrical lead 254 is electrically connected to the light transmissive metallic top-electrode layer 216T. The power supply 250 can be a direct current (DC) supply, an alternating current (AC) supply, or a pulsed supply. Enhanced device stability can sometimes be achieved when the OLED device 200 is operated in the AC mode wherein, for some time period of an AC cycle, the electrical potential is reversed and no current flows through the device. An example of an AC-driven OLED device is described in U.S. Pat. No. 5,552,678. Green light is generated primarily by the dopant(s) 214cg within the light emitting layer 214C, and this generated green light is emitted as green light 280 through the top-electrode layer 216T and through the absorption-reducing layer 222. The emitted green light 280 provides improved luminance efficiency and improved chromaticity due to the microcavity feature of the subpixel pg, as described previously.

Examples of conventional non-microcavity OLED devices, and of microcavity OLED devices constructed in accordance with aspects of the present invention, are described in the following section.

EXAMPLE 7a

Conventional OLED—Comparative

The preparation of a conventional non-microcavity OLED is as follows: A 1 mm thick glass substrate coated with a transparent ITO conductive layer was cleaned and dried using a commercial glass scrubber tool. The thickness of ITO is about 42 nm and the sheet resistance of the ITO is about 68 Ω/square. The ITO surface was subsequently treated with oxidative plasma to condition the surface as an anode. A 1 nm thick layer of CFx, polymerized fluorocarbon, was deposited on the clean ITO surface as the hole-injecting layer by decomposing $CHF_3$ gas in RF plasma treatment chamber. The substrate was then transferred into a vacuum deposition chamber for deposition of all other layers on top of the hole-injecting layer. The following layers were deposited in the following sequence by sublimation from a heated boat under a vacuum of approximately $10^{-6}$ Torr:

(1) a hole-transporting layer, 65 nm thick, consisting of N,N'-di(naphthalene-1-yl)-N,N'-diphenyl-benzidine (NPB);
(2) an electron-transporting layer (also serving as the light-emitting layer), 75 nm thick, consisting of tris(8-hydroxyquinoline)aluminum(III) (Alq);
(3) an electron-injecting layer, 1 nm thick, consisting of Li;
(4) a cathode, approximately 50 nm thick, consisting of Ag.

After the deposition of these layers, the device was transferred from the deposition chamber into a dry box for encapsulation. The completed device structure is denoted as Glass/ITO(42)/CFx(1)/NPB(65)/Alq(75)/Li(1)/Ag(50).

Figure 9:
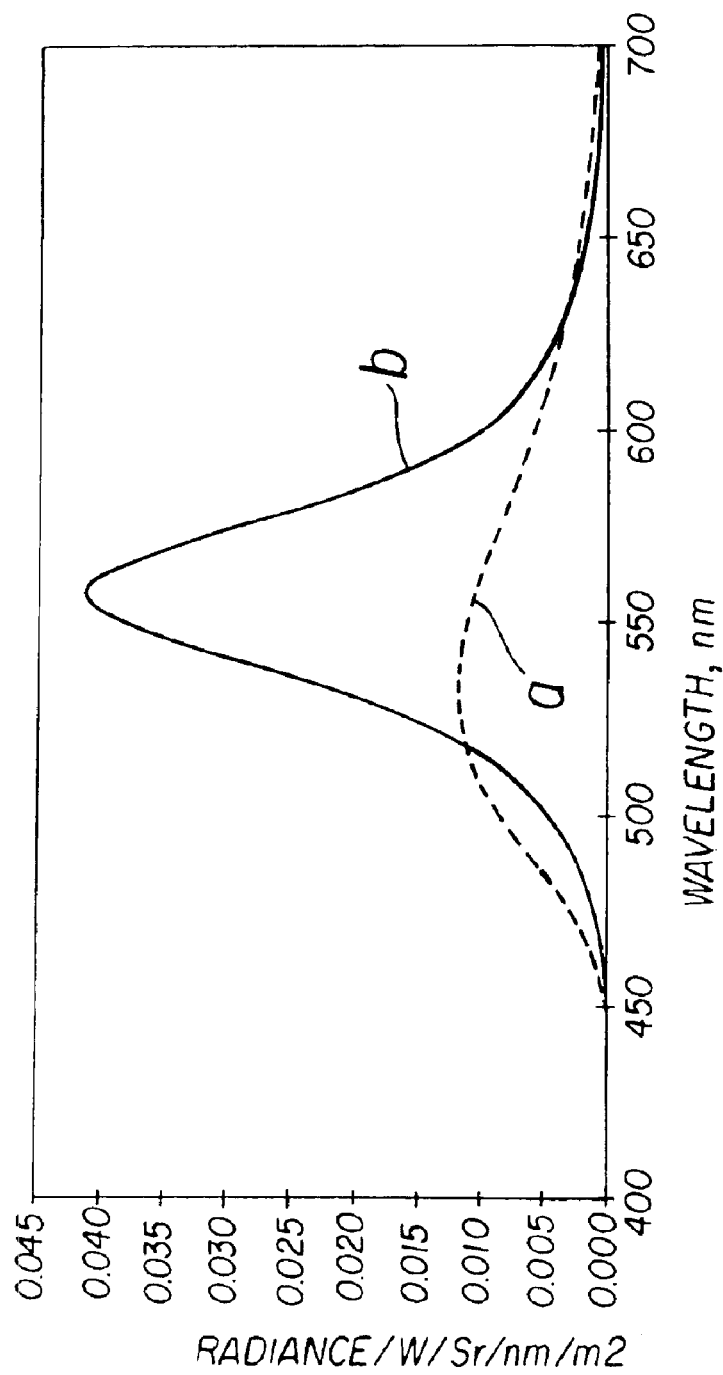
FIG. 9 shows the comparison of emission spectra between an OLED device without microcavity and a microcavity OLED device according to the present invention.

At 20 $mA/cm^2$, this device requires a driving voltage of 7.7 V, its emission output efficiency is 3.3 cd/A, the FWHM bandwidth is 104 nm, and the color coordinates are CIE-x=0.346, CIE-y=0.550. The emission spectrum at 20 $mA/cm^2$ is shown as curve a in FIG. 9. The emission output efficiency measured around the peak emission wavelength of 552 nm is 0.68 $W/Sr/m^2$.

EXAMPLE 7b

Working Example

A microcavity OLED was fabricated as follows. A glass substrate was coated with an anode layer, 93 nm thick, consisting of Ag, by a DC sputtering process at an Ar pressure of about 4 mTorr. A 2 nm thick layer of $MoO_x$, was deposited on the clean Ag surface as the hole-injecting layer by evaporation. The following layers were deposited in the following sequence by sublimation from a heated boat under a vacuum of approximately $10^{-6}$ Torr:

(1) a hole-transporting layer, 45 nm thick, consisting of N,N'-di(naphthalene-1-yl)-N,N'-diphenyl-benzidine (NPB);
(2) an electron-transporting layer (also serving as the light-emitting layer), 65 nm thick, consisting of tris(8-hydroxyquinoline)aluminum(III) (Alq);
(3) an electron-injecting layer, 1 nm thick, consisting of Li;

(4) a cathode, approximately 22.5 nm thick, consisting of Ag;

(5) an absorption-reducing layer, approximately 85 nm thick, consisting of Alq.

After the deposition of these layers, the device was transferred from the deposition chamber into a dry box for encapsulation. The completed device structure is denoted as Glass/Ag(93)/MoO$_x$(2)/NPB(45)/Alq(65)/Li(1)/Ag(22.5)/Alq(85).

At 20 mA/cm$^2$, this device requires a driving voltage of 7.0 Volts, its emission output efficiency is 9.3 cd/A, the FWHM bandwidth is 36 nm, and the color coordinates are CIE-x=0.351, CIE-y=0.626. The emission spectrum at 20 mA/cm2 is shown as curve b in FIG. 9. The emission output efficiency calculated around the peak wavelength of 552 nm is 2.48 W/Sr/m$^2$. Comparing with the results of comparative Example 7a, the microcavity device according to the present invention showed a significant improvement in emission output efficiency (luminance efficiency), a reduction in FWHM bandwidth, and a significant improvement in color, quality, or chromaticity.

It is also instructive to compare this experimental result with the theoretical prediction obtained from the optical model used to create examples 1 through 6. The actual gain in luminance output by a factor of 2.8 seen in this example is in very good agreement with the predicted factor of 2.57 that is obtained from optical modeling of these two structures. The change in the FWHM bandwidth and the change in the CIE color coordinates between these two structures is also predicted with a fair degree of accuracy by the optical model.

EXAMPLE 8a

Conventional OLED—Comparative

The preparation of a conventional non-microcavity blue-emitting OLED is as follows: A 1 mm thick glass substrate coated with a transparent ITO conductive layer was cleaned and dried using a commercial glass scrubber tool. The thickness of ITO is about 42 nm and the sheet resistance of the ITO is about 68 Ω/square. The ITO surface was subsequently treated with oxidative plasma to condition the surface as an anode. A 1 nm thick layer of CFx, polymerized fluorocarbon, was deposited on the clean ITO surface as the hole-injecting layer by decomposing CHF$_3$ gas in RF plasma treatment chamber. The substrate was then transferred into a vacuum deposition chamber for deposition of all other layers on top of the hole-injecting layer. The following layers were deposited in the following sequence by sublimation from a heated boat under a vacuum of approximately 10$^{-6}$ Torr:

(1) a hole-transporting layer, 65 nm thick, consisting of N,N'-di(naphthalene-1-yl)-N,N'-diphenyl-benzidine (NPB);

(2) a light-emitting layer, 20 nm thick, consisting of 2-(t-butyl)-9,10-di-(2-naphthyl)anthracene (TBADN) doped with 1.5% 4-(Di-p-Tolylamino)-4'-[(di-p-tolylamino) styryl]stilbene;

(3) an electron-transporting layer, 35 nm thick, consisting of tris(8-hydroxyquinoline)aluminum(III) (Alq);

(4) an electron-injecting layer, 1 nm thick, consisting of Li; and (5) a cathode, approximately 50 nm thick, consisting of Ag.

After the deposition of these layers, the device was transferred from the deposition chamber into a dry box for encapsulation. The completed device structure is denoted as Glass/ITO(42)/CFx(1)/NPB(65)/TBADN:1.5% 4-(Di-p-Tolylamino)-4'-[(di-p-tolylamino)styryl]stilbene (20)/Alq(35)/Li(1)/Ag(50).

This bottom-emitting device requires a driving voltage of 6.6 V to pass 20 mA/cm$^2$, its luminance efficiency is 4.72 cd/A, the FWHM bandwidth is 64 nm, and the color coordinates are CIE-x=0.16, CIE-y=0.24. The emission spectrum at 20 mA/cm$^2$ is shown as curve a in FIG. 6.

EXAMPLE 8b

Working Example

A microcavity blue-emitting OLED was fabricated as follows. A glass substrate was coated with an anode layer, 93 nm thick, consisting of Ag, by a DC sputtering process at an Ar pressure of about 4 mTorr. The following layers were deposited in the following sequence by sublimation from a heated boat under a vacuum of approximately 10$^{-6}$ Torr:

(1) a hole-injecting layer consisting of MoO$_x$, molybdenum oxide, from a boat containing MoO$_3$ source material, 2 nm thick, (2) a hole-transporting layer, 160 nm thick, consisting of N,N'-di(naphthalene-1-yl)-N,N'-diphenyl-benzidine (NPB);

(3) a light-emitting layer, 20 nm thick, consisting of 2-(t-butyl)-9,10-di-(2-naphthyl)anthracene (TBADN) doped with 1.5% 4-(Di-p-Tolylamino)-4'-[(di-p-tolylamino) styryl]stilbene;

(4) an electron-transporting layer, 30 nm thick, consisting of tris(8-hydroxyquinoline)aluminum(III) (Alq);

(5) an electron-injecting layer, 1 nm thick, consisting of Li;

(6) a cathode, approximately 16 nm thick, consisting of Ag; and (7) an absorption-reducing layer, approximately 72 nm thick, consisting of Alq;

After the deposition of these layers, the device was transferred from the deposition chamber into a dry box for encapsulation. The completed device structure is denoted as Glass/Ag(93)/MoOx(2)/NPB(160)/TBADN: 1.5% 4-(Di-p-Tolylamino)-4'-[(di-p-tolylamino)styryl]stilbene(20)/Alq (30)/Li(1)/-Ag(16)/Alq(72).

Figure 10:
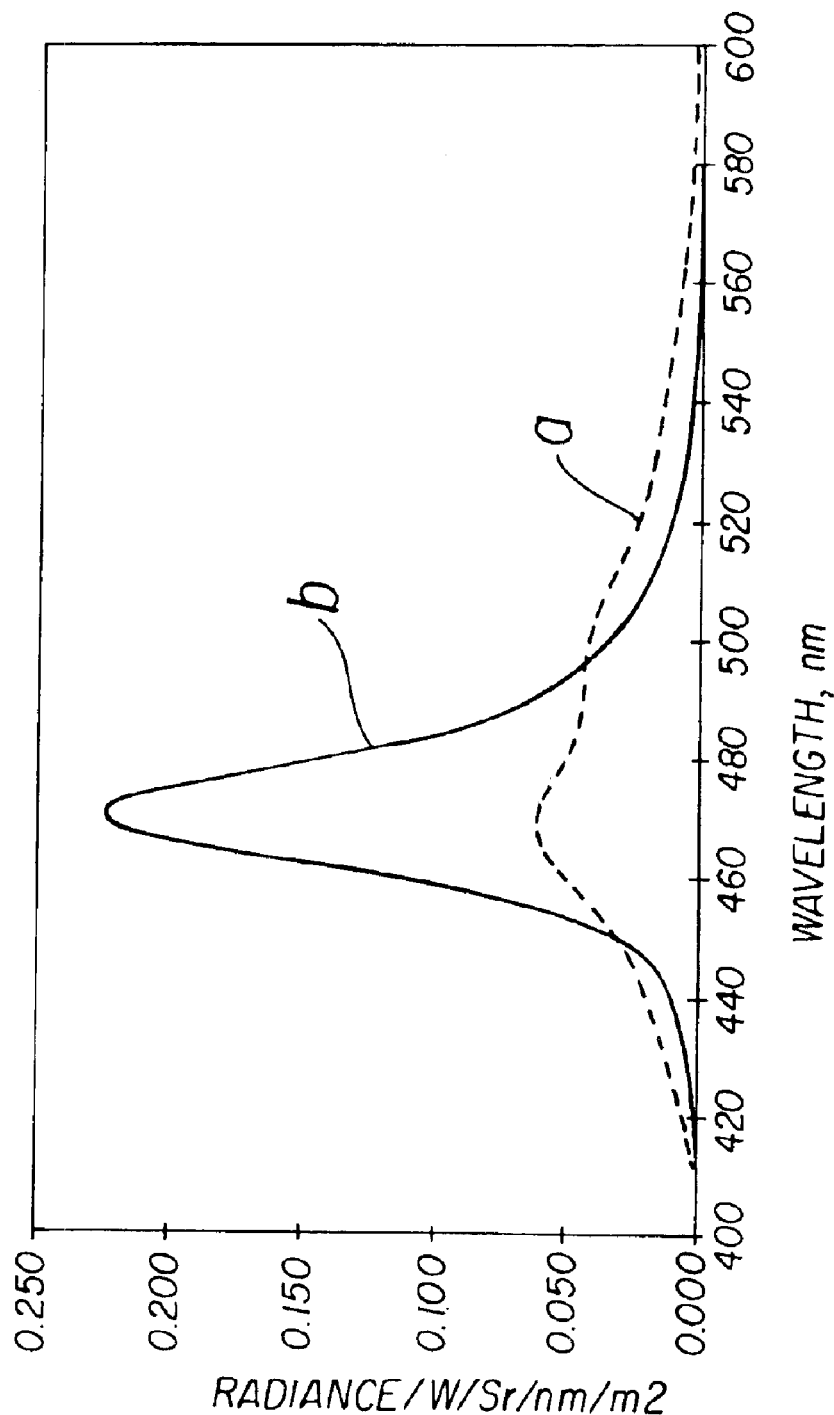
FIG. 10 shows another comparison of emission spectra between an OLED device without microcavity and a microcavity OLED device according to the present invention.

This top-emitting device requires a driving voltage of 6.5 V to pass 20 mA/cm2, its luminance efficiency is 3.93 cd/A, the FWHM bandwidth is 24 nm, and the color coordinates are CIE-x=0.119, CIE-y=0.130. The emission spectrum at 20 mA/cm$^2$ is shown as curve b in FIG. 10. Compared with the results of comparative Example 8a, the microcavity device according to the present invention showed a significant reduction in FWHM bandwidth, and a significant improvement in color quality. Although the luminance efficiency decreased from 4.72 Cd/A to about 3.93 Cd/A, the reduction is due to the absence of high luminance green component in the microcavity device. The amount of the desired blue luminance is actually increased, as evidenced by the almost 4 times increase in the radiance peak height.

EXAMPLE 9a

Conventional OLED—Comparative

The preparation of a conventional non-microcavity green emitting OLED is as follows: A 1 mm thick glass substrate coated with a transparent ITO conductive layer was cleaned and dried using a commercial glass scrubber tool. The thickness of ITO is about 42 nm and the sheet resistance of the ITO is about 68 Ω/square. The ITO surface was subsequently treated with oxidative plasma to condition the surface as an anode. A 1 nm thick layer of CFx, polymerized fluorocarbon, was deposited on the clean ITO surface as the hole-injecting layer by decomposing CHF$_3$ gas in RF plasma treatment chamber. The substrate was then transferred into a vacuum deposition chamber for deposition of all other layers on top of the hole-injecting layer. The following layers were deposited in the following sequence by sublimation from a heated boat under a vacuum of approximately $10^{-6}$ Torr:
(1) a hole-injecting layer, 3 nm thick, consisting of $MoO_x$, molybdenum oxide, from a boat containing $MoO_3$ source material,
(2) a hole-transporting layer, 75 nm thick, consisting of N,N'-di(naphthalene-1-yl)-N,N'-diphenyl-benzidine (NPB),
(3) a light-emitting layer, 37.5 nm thick, consisting of tris(8-hydroxyquinoline)aluminum(III) (Alq) doped with 0.6% N,N-diphenylquinacridone (DPQA),
(4) an electron-transporting layer, 37.5 nm thick, consisting of tris(8-hydroxyquinoline)aluminum(III) (Alq);
(5) an electron-injecting layer, 1 nm thick, consisting of Li; and
(6) a cathode, approximately 50 nm thick, consisting of Ag.
After the deposition of these layers, the device was transferred from the deposition chamber into a dry box for encapsulation. The completed device structure is denoted as Glass/ITO(42)/CFx(1)/MoOx(3)/NPB(75)/Alq:0.6% DPQA(37.5)/-Alq(37.5)/Li(1)/Ag(50).

Figure 11:
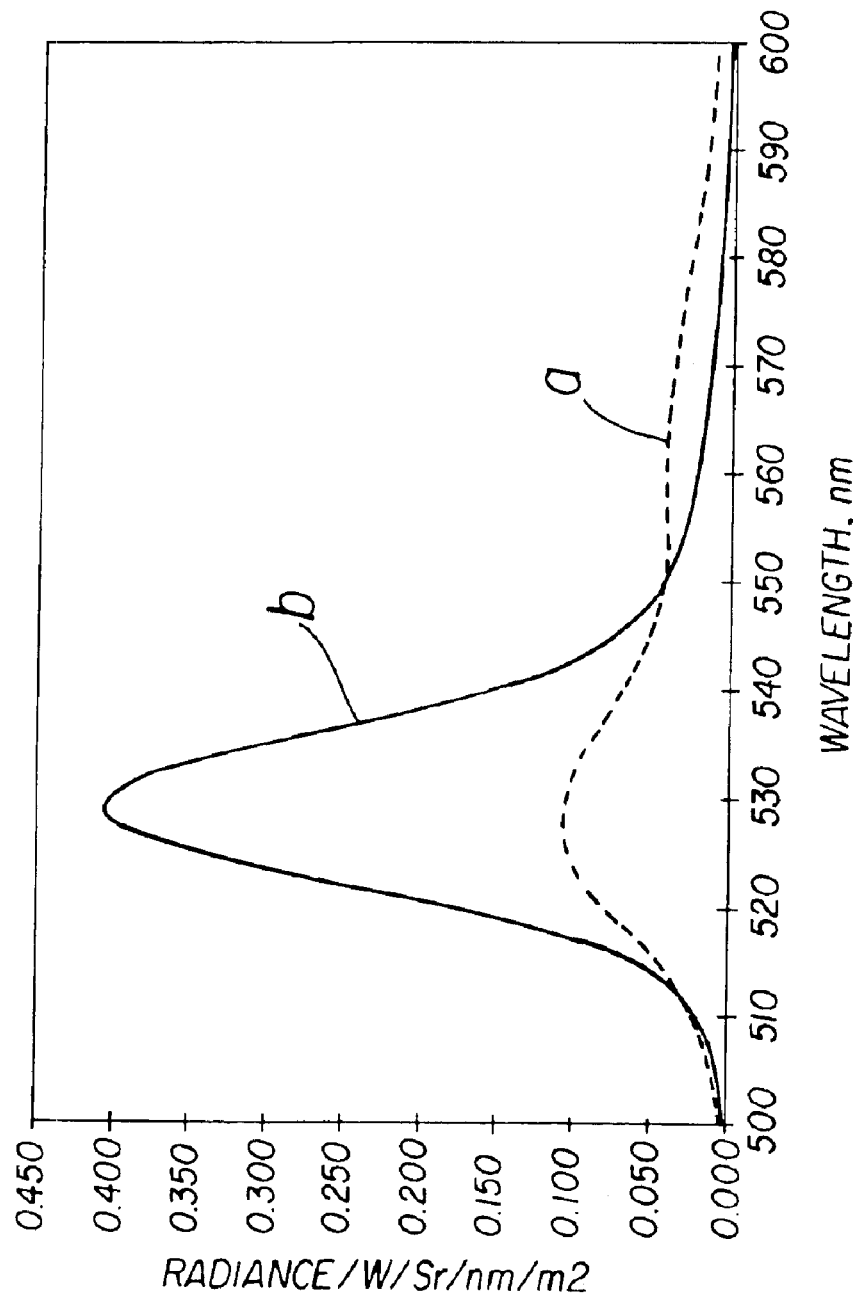
FIG. 11 shows another comparison of emission spectra between an OLED device without a microcavity and a microcavity OLED device according to the present invention.

This bottom-emitting device requires a driving voltage of 9.6 V to pass 20 $mA/cm^2$, its luminance efficiency is 13.5 cd/A, the FWHM bandwidth is 28 nm, and the color coordinates are CIE-x=0.31, CIE-y=0.65. The emission spectrum at 20 $mA/cm^2$ is shown as curve a in FIG. 11.

EXAMPLE 9b

Working Example

A microcavity green emitting OLED was fabricated as follows. A glass substrate was coated with an anode layer, 93 nm thick, consisting of Ag, by a DC sputtering process at an Ar pressure of about 4 mTorr. The substrate was then transferred into a vacuum deposition chamber for deposition of all other layers on top of the anode layer. The following layers were deposited in the following sequence by sublimation from a heated boat under a vacuum of approximately $10^{-6}$ Torr:
(1) a hole-injecting layer consisting of MoOx, molybdenum oxide, from a boat containing $MoO_3$ source material, 3 nm thick,
(2) a hole-transporting layer, 190 nm thick, consisting of N,N'-di(naphthalene-1-yl)-N,N'-diphenyl-benzidine (NPB);
(3) a light-emitting layer, 37.5 nm thick, consisting of tris(8-hydroxyquinoline)aluminum(III) (Alq) doped with 0.6% N,N-diphenylquinacridone (DPQA);
(4) an electron-transporting layer, 40 nm thick, consisting of tris(8-hydroxyquinoline)aluminum(III) (Alq);
(5) an electron-injecting layer, 0.5 nm thick, consisting of Li;
(6) a cathode, approximately 22.5 nm thick, consisting of Ag; and
(7) an absorption-reducing layer, approximately 85 nm thick, consisting of Alq.
After the deposition of these layers, the device was transferred from the deposition chamber into a dry box for encapsulation. The completed device structure is denoted as Glass/Ag(93)/MoOx(3)/NPB(190)/Alq:0.6% DPQA(20)/Alq(40)/–Li(0.5)/Ag(22.5)/Alq(85).

This top-emitting device requires a driving voltage of 8.1 V to pass 20 $mA/cm^2$, its luminance efficiency is 24.6 cd/A, the FWHM bandwidth is 16 nm, and the color coordinates are CIE-x=0.18, CIE-y=0.77. The emission spectrum at 20 $mA/cm^2$ is shown as curve b in FIG. 11. Compared with the results of comparative Example 9a, the microcavity device according to the present invention showed a significant increase in luminance, a significant reduction in FWHM bandwidth, and a significant improvement in color.

EXAMPLE 10a

Conventional OLED—Comparative

The preparation of a conventional non-microcavity red-emitting OLED is as follows: A 1 mm thick glass substrate coated with a transparent ITO conductive layer was cleaned and dried using a commercial glass scrubber tool. The thickness of ITO is about 42 nm and the sheet resistance of the ITO is about 68 $\Omega$/square. The ITO surface was subsequently treated with oxidative plasma to condition the surface as an anode. A 1 nm thick layer of CFx, polymerized fluorocarbon, was deposited on the clean ITO surface as the hole-injecting layer by decomposing $CHF_3$ gas in RF plasma treatment chamber. The substrate was then transferred into a vacuum deposition chamber for deposition of all other layers on top of the hole-injecting layer. The following layers were deposited in the following sequence by sublimation from a heated boat under a vacuum of approximately $10^{-6}$ Torr:
(1) a hole-transporting layer, 65 nm thick, consisting of N,N'-di(naphthalene-1-yl)-N,N'-diphenyl-benzidine (NPB);
(2) a light-emitting layer, 35 nm thick, consisting of a Alq(50%)TBADN(50%) host doped with 5.0% rubrene and 1.8% Propanedinitrile, [2-(1,1-dimethylethyl)-6-[2-(2,3,6,7-tetrahydro-1,1,7,7-tetramethyl-1H,5H-benzo[ij]quinolizin-9-yl)ethenyl]-4H-pyran-4-ylidene] (DCJTB);
(3) an electron-transporting layer, 35 nm thick, consisting of tris(8-hydroxyquinoline)aluminum(III) (Alq);
(4) an electron-injecting layer, 1 nm thick, consisting of Li; and
(5) a cathode, approximately 50 nm thick, consisting of Ag.
After the deposition of these layers, the device was transferred from the deposition chamber into a dry box for encapsulation. The completed device structure is denoted as Glass/ITO(42)/CFx(1)/NPB(65)/Alq(50%)TBADN(50%):5.0% rubrene+1.8% DCJTB(20)/Alq(35)/Li(1)/Ag(50).

Figure 12:
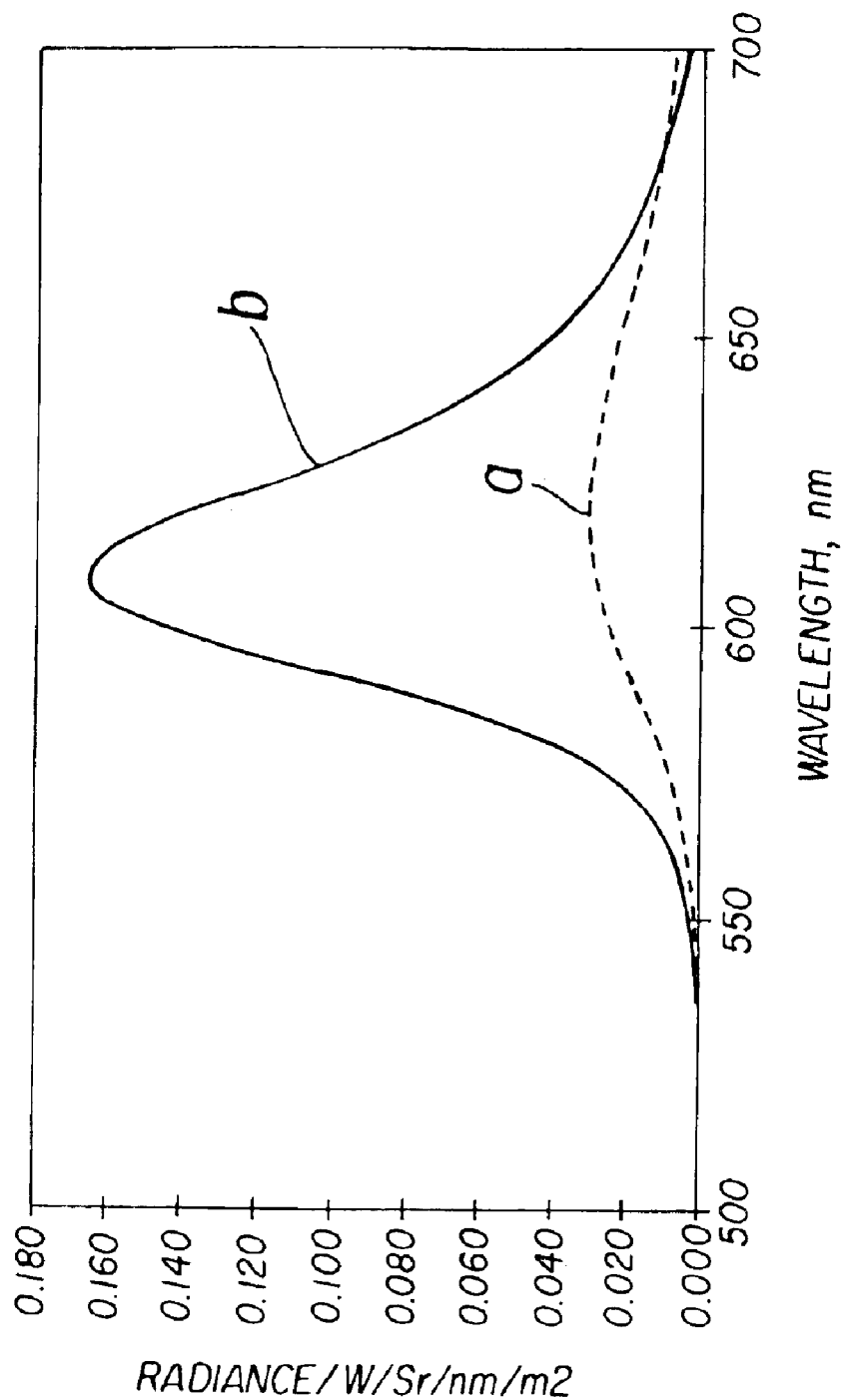
FIG. 12 shows another comparison of emission spectra between an OLED device without microcavity and a microcavity OLED device according to the present invention.

This bottom-emitting device requires a driving voltage of 7.9 V to pass 20 $mA/cm^2$, its luminance efficiency is 3.1 cd/A, the FWHM bandwidth is 84 nm, and the color coordinates are CIE-x=0.63, CIE-y=0.37. The emission spectrum at 20 $mA/cm^2$ is shown as curve a in FIG. 12.

EXAMPLE 10b

Working Example

A microcavity red-emitting OLED was fabricated as follows. A glass substrate was coated with an anode layer, 93 nm thick, consisting of Ag, by a DC sputtering process at an Ar pressure of about 4 mTorr. The substrate was then transferred into a vacuum deposition chamber for deposition of all other layers on top of the anode layer. The following layers were deposited in the following sequence by sublimation from a heated boat under a vacuum of approximately $10^{-6}$ Torr:
(1) a hole-injecting layer, 2 nm thick, consisting of $MoO_x$, molybdenum oxide, from a boat containing $MoO_3$ source material;
(2) a hole-transporting layer, 40 nm thick, consisting of N,N'-di(naphthalene-1-yl)-N,N'-diphenyl-benzidine (NPB);
(3) a light-emitting layer, 35 nm thick, consisting of a Alq(50%)TBADN(50%) host doped with 5.0% rubrene and 1.8% Propanedinitrile, [2-(1,1-dimethylethyl)-6-[2-(2,3,6,7-tetrahydro-1,1,7,7-tetramethyl-1H,5H-benzo[ij]quinolizin-9-yl)ethenyl]-4H-pyran-4-ylidene] (DCJTB);

(4) an electron-transporting layer, 68 nm thick, consisting of tris(8-hydroxyquinoline)aluminum(III) (Alq);

(5) an electron-injecting layer, 1 nm thick, consisting of Li;

(6) a cathode, approximately 22.5 nm thick, consisting of Ag; and (7) an absorption-reducing layer, approximately 85 nm thick, consisting of Alq.

After the deposition of these layers, the device was transferred from the deposition chamber into a dry box for encapsulation. The completed device structure is denoted as Glass/Ag(93)/MoOx(2)/NPB(40)/Alq(50%)TBADN(50%):5.0% rubrene+1.8% DCJTB(20)/Alq(68)/Li(1)/Ag(22.5)/Alq(85).

This top-emitting device requires a driving voltage of 7.6 V to pass 20 mA/cm$^2$, its luminance efficiency is 13.7 cd/A, the FWHM bandwidth is 44 nm, and the color coordinates are CIE-x=0.18, CIE-y=0.77. The emission spectrum at 20 mA/cm$^2$ is shown as curve b in FIG. 12. Compared with the results of comparative Example 10a, the microcavity device according to the present invention showed a significant increase in luminance and a significant reduction in FWHM bandwidth.

EXAMPLE 11a

Conventional OLED—Comparative

The preparation of a conventional non-microcavity OLED using a phosphorescent dopant is as follows: A 1 mm thick glass substrate coated with a transparent ITO conductive layer was cleaned and dried using a commercial glass scrubber tool. The thickness of ITO is about 42 nm and the sheet resistance of the ITO is about 68 Ω/square. The ITO surface was subsequently treated with oxidative plasma to condition the surface as an anode. A 1 nm thick layer of CFx, polymerized fluorocarbon, was deposited on the clean ITO surface as the hole-injecting layer by decomposing CHF$_3$ gas in RF plasma treatment chamber. The substrate was then transferred into a vacuum deposition chamber for deposition of all other layers on top of the hole-injecting layer. The following layers were deposited in the following sequence by sublimation from a heated boat under a vacuum of approximately 10$^{-6}$ Torr:

(1) a hole-transporting layer, 75 nm thick, consisting of N,N'-di(naphthalene-1-yl)-N,N'-diphenyl-benzidine (NPB);

(2) a light-emitting layer, 35 nm thick, consisting of a 4,4'-N,N'-dicarbazole-biphenyl (CBP) host doped with 6% fac-tris(2-phenylpyridinato-N,C$^{2'}$)Iridium(III) (Ir(ppy)$_3$);

(3) a hole-blocking layer, 10 nm thick, consisting of bis(2-methyl-8-quinolinolato)(4-phenylphenolato)Aluminum (III) (BAlQ);

(4) an electron-transporting layer, 40 nm thick, consisting of tris(8-hydroxyquinoline)aluminum(III) (Alq);

(5) an electron-injecting layer, 1 nm thick, consisting of Li; and (6) a cathode, approximately 50 nm thick, consisting of Ag.

After the deposition of these layers, the device was transferred from the deposition chamber into a dry box for encapsulation. The completed device structure is denoted as Glass/ITO(42)/CFx(1)/NPB(75)/CBP:6% Ir(ppy)$_3$(35)/BAlq(10)/-Alq(40)/Li(1)/Ag(50).

Figure 13:
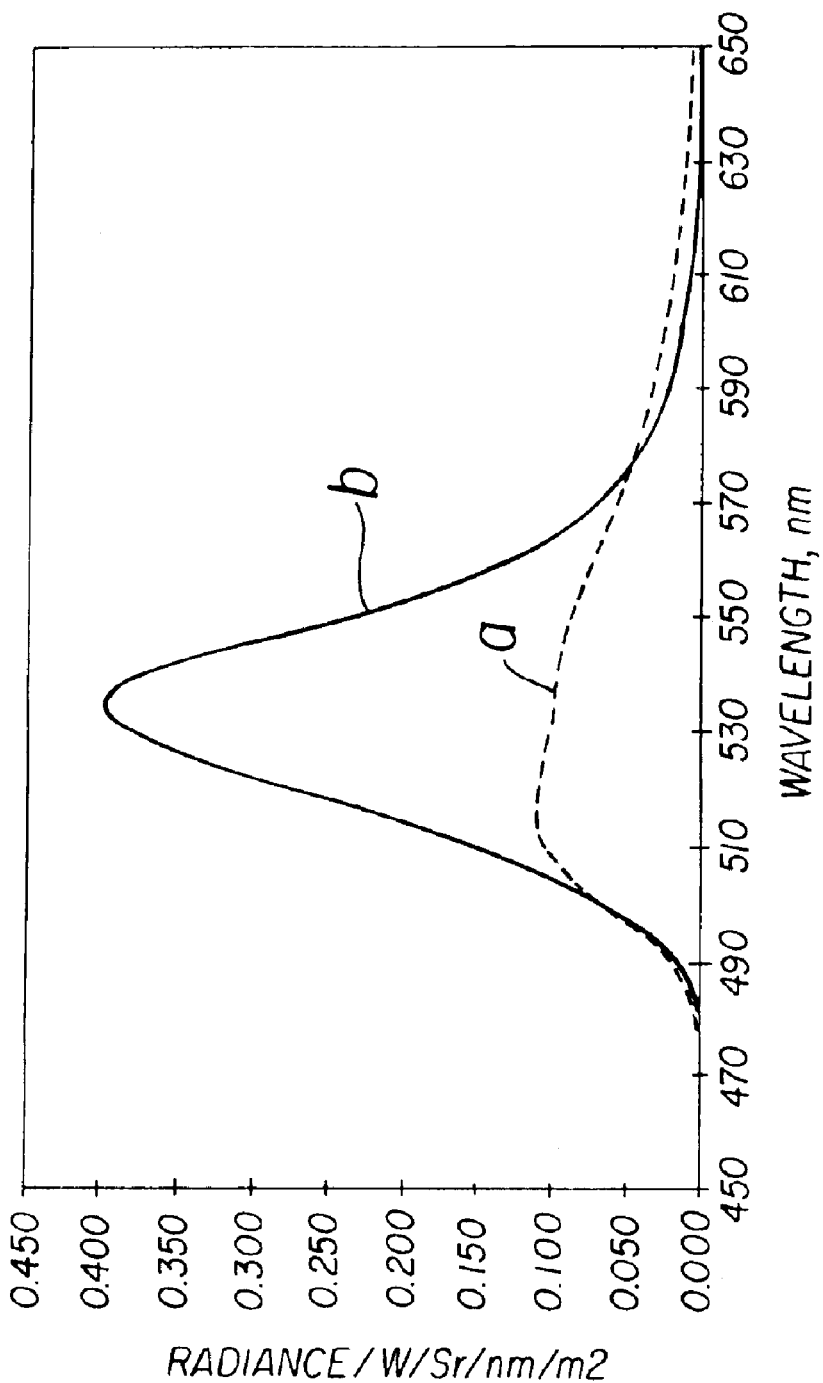
FIG. 13 shows another comparison of emission spectra between an OLED device without microcavity and a microcavity OLED device according to the present invention.

This bottom-emitting device requires a driving voltage of 10.4 V to pass 20 mA/cm$^2$, its luminance efficiency is 22.2 cd/A, the FWHM bandwidth is 72 nm, and the color coordinates are CIE-x=0.310, CIE-y=0.623. The emission spectrum at 20 mA/cm$^2$ is shown as curve a in FIG. 13.

EXAMPLE 11b

Working Example

A microcavity OLED using a phosphorescent dopant was fabricated as follows. A glass substrate was coated with an anode layer, 93 nm thick, consisting of Ag, by a DC sputtering process at an Ar pressure of about 4 mTorr. The substrate was then transferred into a vacuum deposition chamber for deposition of all other layers on top of the anode layer. The following layers were deposited in the following sequence by sublimation from a heated boat under a vacuum of approximately 10$^{-6}$ Torr:

(1) a hole-injecting layer, 3 nm thick, consisting of MoOx, molybdenum oxide, from a boat containing MoO$_3$ source material;

(2) a hole-transporting layer, 40 nm thick, consisting of N,N'-di(naphthalene-1-yl)-N,N'-diphenyl-benzidine (NPB);

(3) a light-emitting-layer, 30 nm thick, consisting of a 4,4'-N,N'-dicarbazole-biphenyl (CBP) host doped with 6% fac-tris(2-phenylpyridinato-N,C$^{2'}$)Iridium(III) (Ir(ppy)$_3$);

(4) a hole-blocking layer, 10 nm thick, consisting of bis(2-methyl-8-quinolinolato)(4-phenylphenolato)Aluminum (III) (BAlQ);

(5) an electron-transporting layer, 15 nm thick, consisting of tris(8-hydroxyquinoline)aluminum(III) (Alq);

(6) an electron-injecting layer, 1 nm thick, consisting of Li;

(7) a cathode, approximately 22.5 nm thick, consisting of Ag; and (8) an absorption-reducing layer, approximately 85 nm thick, consisting of Alq.

After the deposition of these layers, the device was transferred from the deposition chamber into a dry box for encapsulation. The completed device structure is denoted as Glass/Ag(93)/MoO$_x$(3)/NPB(40)/CBP:6% Ir(ppy)$_3$(30)/BAlq(10)/-Alq(15)/Li(1)/Ag(22.5)/Alq(85).

This top-emitting device requires a driving voltage of 8.2 V to pass 20 mA/cm$^2$, its luminance efficiency is 50.5 cd/A, the FWHM bandwidth is 40 nm, and the color coordinates are CIE-x=0.25, CIE-y=0.703. The emission spectrum at 20 mA/cm$^2$ is shown as curve b in FIG. 13. Compared with the results of comparative Example 11a, the microcavity device according to the present invention showed a significant increase in luminance and a significant reduction in FWHM bandwidth.

In the foregoing description, illustrative embodiments of inventive microcavity OLED devices have been disclosed in which the organic EL medium structure included a plurality of organic layers. It will be appreciated that a microcavity OLED device can be constructed in accordance with the present invention wherein the organic EL medium structure includes at least an organic light-emitting layer disposed between the metallic electrode layers. Polymer light-emitting diode devices (PLEDs) are exemplary organic light-emitting diode devices in which the organic EL medium structure is comprised of a single polymeric light-emitting layer which can be disposed between the metallic electrode layers to provide a microcavity device in accordance with aspects of the present invention.

The invention has been described in detail with particular reference to certain preferred embodiments thereof, but it will be understood that variations and modifications can be effected within the spirit and scope of the invention.

PARTS LIST 10 substrate
12a transparent bottom-electrode layer
12T light transmissive metallic bottom-electrode layer
12R reflective metallic bottom-electrode
14 organic EL medium structure
14a hole-injecting layer
14b hole-transporting layer
14c light emitting layer
14d electron-transporting layer
14e electron-injecting layer
16a transparent top-electrode
16R reflective metallic top-electrode layer
16T light transmissive metallic top-electrode layer
18 QWS (quarter wave stack) reflecting mirror
20 transparent conductive phase-layer
22 absorption-reducing layer
101 conventional bottom-emitting OLED device
102 QWS based microcavity OLED device
103a microcavity OLED device
103b bottom-emitting OLED device without microcavity
103c QWS based bottom-emitting microcavity OLED device
103d all Ag electrodes bottom-emitting microcavity OLED device with an absorption-reducing layer
104a all Ag electrodes top-emitting microcavity OLED device
104b top-emitting OLED device without microcavity
104c QWS based top-emitting microcavity OLED device
104d all Ag electrodes top-emitting microcavity OLED device with an absorption-reducing layer

PARTS LIST (con't)

200 top-emitting full-color microcavity OLED display device
200m modified top-emitting full-color microcavity OLED display device
210 substrate
210s substrate surface
212R reflective metallic bottom-electrode layer
214 organic EL medium structure
214a hole-injecting layer
214b hole-transporting layer
214bb hole-transporting layer of a thickness tuned for blue light
214bg hole-transporting layer of a thickness tuned for green light
214br hole-transporting layer of a thickness tuned for red light
214c light emitting layer
214cb blue-light emitting dopant(s) in light emitting layer
214cg green-light emitting dopant(s) in light emitting layer
214cr red-light emitting dopant(s) in light emitting layer
214ch organic host material(s) in light emitting layer
214d electron-transporting layer
214e electron-injecting layer
216T light transmissive metallic top-electrode layer
220g transparent conductive phase-layer of a modified green-light emitting subpixel (pgm)
222 absorption-reducing layer
250 voltage/current source
252 electrical lead
254 electrical lead
280g emitted green light
pb blue-light emitting subpixel(s)
pg green-light emitting subpixel(s)
pgm modified green-light emitting subpixel(s)

PARTS LIST (con't)

pr red-light emitting subpixel(s)
px pixel
$t_b$ total thickness of EL medium structure of blue-light emitting subpixel(s)
$t_g$ total thickness of EL medium structure of green-light emitting subpixel(s)
$t_r$ total thickness of EL medium structure of red-light emitting subpixel(s)

What is claimed is:

1. A microcavity OLED device having improved luminance efficiency and improved chromaticity of emitted light, comprising:

a) a substrate;
   b) a microcavity having a selected cavity length defined over one substrate surface by, in sequence, a metallic bottom-electrode layer, an organic electroluminescent (EL) medium structure, and a metallic top-electrode layer,
   wherein one of the metallic electrode layers is light transmissive and the other one is substantially opaque and reflective;
   wherein the material for the light transmissive electrode layer includes Ag, Au, or alloys thereof, and the material for the opaque and reflective electrode layer includes Ag, Au, Al, or alloys thereof;
   wherein the organic EL medium structure includes at least a light-emitting layer comprised of at least one organic host material and at least one dopant material dispersed in the at least one host material;
   wherein the selected cavity length is provided by selection of a thickness of at least one of the organic layers;
   wherein the at least one dopant material is selected from the class of fluorescent dyes consisting of derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl)methane compounds, and carbostyryl compounds, so that one of red, green, or blue light is generated in the light-emitting layer; and
   wherein the selected cavity length of the microcavity OLED device is tuned to provide a resonance condition for emission of one of red, green, or blue light through the light transmissive electrode layer and having the improved luminance efficiency and the improved chromaticity.

2. The microcavity OLED device according to claim 1 wherein both the metallic electrode layers are Ag or Ag alloys and the thickness of the light transmissive electrode layer is between 10 nm and 30 nm.

3. The microcavity OLED device according to claim 1 wherein the bottom-electrode layer is light transmissive and the light is emitted through the substrate.

4. The microcavity OLED device according to claim 3 wherein the device further includes a high index of refraction absorption-reducing layer disposed between the light transmissive bottom-electrode layer and the substrate.

5. The microcavity OLED device according to claim 4 wherein the absorption-reducing layer has an index of refraction greater than 1.6.

6. The microcavity OLED device according to claim 4 wherein the material for the light transmissive electrode layer further includes Al, Cu, alloys thereof, or MgAg alloys with less than 50% Ag.

7. The microcavity OLED device according to claim 1 wherein the top-electrode layer is light transmissive and the light is emitted through the light transmissive top-electrode layer.

8. The microcavity OLED device according to claim 7 wherein the device further includes a high index of refraction absorption-reducing layer disposed over the light transmissive top-electrode layer.

9. The microcavity OLED device according to claim 8 wherein the absorption-reducing layer has an index of refraction greater than 1.6.

10. The microcavity OLED device according to claim 8 wherein the material for the light transmissive electrode further includes Al, Cu, alloys thereof, or MgAg alloys with less than 50% Ag.

11. The microcavity OLED device according to claim 1 wherein the bottom-electrode layer is the anode and the top-electrode layer is the cathode.

12. The microcavity OLED device according to claim 1 wherein the bottom-electrode layer is the cathode and the top-electrode layer is the anode.

13. The microcavity OLED device according to claim 1 wherein the organic EL medium structure further includes an electron-injecting layer.

14. The microcavity OLED device according to claim 13 wherein the electron-injecting layer is formed of a material selected from the group consisting of alkaline metals, alkaline earth metals, and organic materials doped with at least one of these metals.

15. The microcavity OLED device according to claim 1 wherein the organic EL medium structure further includes a hole-injecting layer.

16. The microcavity OLED device according to claim 15 wherein the hole-injecting layer is formed of a material selected from the group consisting of molybdenum oxide (MoOx), vanadium oxide (VOx), nickel oxide (NiOx), phthalocyanines, and plasma-deposited fluorocarbon (CFx).

17. The microcavity OLED device according to claim 1 wherein the device further includes a transparent electrically conductive phase-layer disposed over the metallic bottom-electrode layer.

18. The microcavity OLED device according to claim 17 wherein the selected cavity length is provided by selection of a thickness of the phase-layer.

19. The microcavity OLED device according to claim 1 wherein the at least one organic host material is selected to have a band gap energy level which is higher than a band gap energy level of the at least one fluorescent dye dopant material.

20. The microcavity OLED device according to claim 19 wherein the at least one organic host material is a hole-transporting host material.

21. The microcavity OLED device according to claim 19 wherein the at least one organic host material is an electron-transporting host material.

22. A microcavity OLED device having improved luminance efficiency and improved chromaticity of emitted light, comprising:
   a) a substrate;
   b) a microcavity having a selected cavity length defined over one substrate surface by, in sequence, a metallic bottom-electrode layer, an organic electroluminescent (EL) medium structure, and a metallic top-electrode layer,
      wherein one of the metallic electrode layers is light transmissive and the other one is substantially opaque and reflective;
      wherein the material for the light transmissive electrode layer includes Ag, Au, or alloys thereof, and the material for the opaque and reflective electrode layer includes Ag, Au, Al, or alloys thereof;
      wherein the organic EL medium structure includes at least a light-emitting layer comprised of at least one organic host material and at least one dopant material dispersed in the at least one host material;
      wherein the selected cavity length is provided by selection of a thickness of at least one of the organic layers;
      wherein the at least one dopant material is selected from the class of phosphorescent compounds consisting of cyclometallated Ir(III) complexes, cyclometallated Pt(II) complexes, Pt(II) porphyrin complexes, and trivalent lanthanide complexes, so that one of red, green, or blue light is generated in the light-emitting layer; and
      wherein the selected cavity of the microcavity OLED device is tuned to provide a resonance condition for emission of one of red, green, or blue light through the light transmissive electrode layer and having the improved luminance efficiency and the improved chromaticity.

23. The microcavity OLED device according to claim 22 wherein both the metallic electrode layers are Ag or Ag alloys and the thickness of the light transmissive electrode layer is between 10 nm and 30 nm.

24. The microcavity OLED device according to claim 22 wherein the bottom-electrode layer is light transmissive and the light is emitted through the substrate.

25. The microcavity OLED device according to claim 24 wherein the device further includes a high index of refraction absorption-reducing layer disposed between the light transmissive bottom-electrode layer and the substrate.

26. The microcavity OLED device according to claim 25 wherein the absorption-reducing layer has an index of refraction greater than 1.6.

27. The microcavity OLED device according to claim 25 wherein the material for the light transmissive electrode layer further includes Al, Cu, alloys thereof, or MgAg alloys with less than 50% Ag.

28. The microcavity OLED device according to claim 22 wherein the top-electrode layer is light transmissive and the light is emitted through the light transmissive top-electrode layer.

29. The microcavity OLED device according to claim 28 wherein the device further includes a high index of refraction absorption-reducing layer disposed over the light transmissive top-electrode layer.

30. The microcavity OLED device according to claim 29 wherein the absorption-reducing layer has an index of refraction greater than 1.6.

31. The microcavity OLED device according to claim 29 wherein the material for the light transmissive electrode further includes Al, Cu, alloys thereof, or MgAg alloys with less than 50% Ag.

32. The microcavity OLED device according to claim 22 wherein the bottom-electrode layer is the anode and the top-electrode layer is the cathode.

33. The microcavity OLED device according to claim 22 wherein the bottom-electrode layer is the cathode and the top-electrode layer is the anode.

34. The microcavity OLED device according to claim 22 wherein the organic EL medium structure further includes an electron-injecting layer.

35. The microcavity OLED device according to claim 34 wherein the electron-injecting layer is formed of a material selected from the group consisting of alkaline metals, alkaline earth metals, and organic materials doped with at least one of these metals.

36. The microcavity OLED device according to claim 22 wherein the organic EL medium structure further includes a hole-injecting layer.

37. The microcavity OLED device according to claim 36 wherein the hole-injecting layer is formed of a material selected from the group consisting of molybdenum oxide (MoOx), vanadium oxide (VOx), nickel oxide (NiOx), phthalocyanines, and plasma-deposited fluorocarbon (CFx).

38. The microcavity OLED device according to claim 22 wherein the device further includes a transparent electrically conductive phase-layer disposed over the metallic bottom-electrode layer.

39. The microcavity OLED device according to claim 38 wherein the selected cavity length is provided by selection of a thickness of the phase-layer.

40. The microcavity OLED device according to claim 22 wherein the at least one organic host material is selected to have a band gap energy level which is higher than a band gap energy level of the at least one fluorescent or phosphorescent dye dopant material.

41. The microcavity OLED device according to claim 40 wherein the at least one organic host material is a hole-transporting host material.

42. The microcavity OLED device according to claim 40 wherein the at least one organic host material is an electron-transporting host material.

43. The microcavity OLED device according to claim 22 wherein the phosphorescent cyclometallated Ir(III) complex is selected from fac-tris(2-phenylpyridinato-$N,C^{2'}$)Iridium (III), bis(2-phenylpyridinato-$N,C^{2'}$)Iridium(III)(acetylacetonate), bis(2-(2'-benzothienyl)pyridinato-$N,C^{2'}$)Iridium(III)(acetylacetonate), tris(1-phenylisoquinolinato-$N,C^{2'}$)Iridium(III), or bis(2-(4,6-difluorophenyl)-pyridinato-$N,C^{2'}$)Iridium(III)(picolinate).

44. The microcavity OLED device according to claim 22 wherein the phosphorescent cyclometallated Pt(II) complex includes cis-bis(2-phenylpyridinato-$N,C^{2'}$)platinum(II), cis-bis(2-(2'-thienyl)pyridinato-$N,C^{3'}$)platinum(II), cis-bis(2-(2'-thienyl)quinolinato-$N,C^{5'}$)platinum(II), or (2-(4,6-difluorophenyl)pyridinato-$NC^{2'}$) platinum (II) acetylacetonate.

45. The microcavity OLED device according to claim 22 wherein the phosphorescent Pt(II) porphyrin complex is 2,3,7,8,12,13,17,18-octaethyl-21H, 23H-porphine platinum (II).

46. The microcavity OLED device according to claim 22 wherein the phosphorescent trivalent lanthanide complex includes a $Tb^{3+}$ complex or a $Eu^{3+}$ complex.

47. The microcavity OLED device according to claim 42 wherein the at least one organic host material is selected to have the energy of its lowest triplet excited state at least about equal to or greater than that of the phosphorescent dopant.

48. The microcavity OLED device according to claim 22 wherein the at least one organic host material is a hole-transporting host material.

49. The microcavity OLED device according to claim 48 wherein the hole-transporting host material is a substituted tri-aryl amine compound.

50. The microcavity OLED device according to claim 48 wherein the hole-transporting host material is an aryl-substituted carbazole compound.

51. The microcavity OLED device according to claim 50 wherein the carbazole compound is 4,4'-N,N'-dicarbazole-biphenyl.

52. The microcavity OLED device according to claim 47 wherein the at least one organic host material is an electron-transporting host material.

53. The microcavity OLED device according to claim 52 wherein the electron-transporting host material is selected from the group consisting of aryl-substituted oxadiazoles, aryl-substituted triazoles, aryl-substituted phenanthrolines, and metal quinoxolates.

54. A full-color microcavity OLED display device including red, green, and blue subpixels and having improved luminance efficiency and improved chromaticity of red, green, and blue light emitted from corresponding subpixels, comprising:

a) a substrate;
b) a microcavity defined over one substrate surface by, in sequence, a metallic bottom-electrode layer, an organic electroluminescent (EL) medium structure, and a metallic top-electrode layer,
wherein the microcavity has a different selected cavity length for each of the red, green, and blue sub-pixels;
wherein one of the metallic electrode layers is light transmissive and the other one is substantially opaque and reflective;
wherein the material for the light transmissive electrode layer includes Ag, Au, or alloys thereof, and the material for the opaque and reflective electrode layer includes Ag, Au, Al, or alloys thereof;
wherein the organic EL medium structure includes at least a pixelated light-emitting layer comprised of at least one organic host material and at least one different dopant material dispersed in the at least one host material in correspondence with the red, green, and blue subpixels;
wherein the different selected cavity length is provided by selection of a thickness of at least one pixelated organic layer;
wherein the at least one dopant material is selected to generate red light, another at least one dopant material is selected to generate green light, and another at least one dopant material is selected to generate blue light in the light-emitting layer;
wherein each of the at least one dopant materials is selected from the class of fluorescent dyes consisting of derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl)methane compounds, and carbostyryl compounds; or the class of phosphorescent compounds consisting of cyclometallated Ir(III) complexes, cyclometallated Pt(II) complexes, Pt(II) porphyrin complexes, and trivalent lanthanide complexes, so that one of red, green, or blue light is generated in the light-emitting layer; and
wherein each of the different selected cavity length is selected so that the microcavity of each of the red, green, and blue subpixels of the full-color microcavity OLED display device is tuned to provide a resonance condition for emission of red, green, or blue light, respectively, through the light transmissive electrode layer and having the improved luminance efficiency and the improved chromaticity.

55. The full-color microcavity OLED display device according to claim 54 wherein both the metallic electrode layers are Ag and the thickness of the light transmissive electrode layer is between 10 nm and 30 nm.

56. The full-color microcavity OLED display device according to claim 54 wherein both the bottom-emitting layer is light transmissive and the light is emitted through the substrate.

57. The full-color microcavity OLED display device according to claim 56 wherein the device further includes a high index of refraction absorption-reducing layer disposed between the light transmissive bottom-electrode layer and the substrate.

58. The full-color microcavity OLED display device according to claim 57 wherein the absorption-reducing layer has an index of refraction greater than 1.6.

59. The full-color microcavity OLED display device according to claim 57 wherein the material for the light transmissive electrode layer further includes Al, Cu, alloys thereof, or MgAg alloys with less than 50% Ag.

60. The full-color microcavity OLED display device according to claim 54 wherein the top-electrode layer is light transmissive and the light is emitted through the light transmissive top-electrode layer.

61. The full-color microcavity OLED display device according to claim 60 wherein the device further includes a high index of refraction absorption-reducing layer disposed over the light transmissive top-electrode layer.

62. The full-color microcavity OLED display device according to claim 61 wherein the absorption-reducing layer has an index of refraction greater than 1.6.

63. The full-color microcavity OLED display device according to claim 61 wherein the material for the light transmissive electrode further includes Al, Cu, alloys thereof, or MgAg alloys with less than 50% Ag.

64. The full-color microcavity OLED display device according to claim 54 wherein the bottom-electrode layer is the anode and the top-electrode layer is the cathode.

65. The full-color microcavity OLED display device according to claim 54 wherein the bottom-electrode layer is the cathode and the top-electrode layer is the anode.

66. The full-color microcavity OLED display device according to claim 64 wherein the organic EL medium structure further includes an electron-injecting layer.

67. The full-color microcavity OLED display device according to claim 66 wherein the electron-injecting layer is formed of a material selected from the group consisting of alkaline metals, alkaline earth metals, and organic materials doped with at least one of these metals.

68. The full-color microcavity OLED display device according to claim 54 wherein the organic EL medium structure further includes a hole-injecting layer.

69. The full-color microcavity OLED display device according to claim 68 wherein the hole-injecting layer is formed of a material selected from the group consisting of molybdenum oxide (MoOx), vanadium oxide (VOx), nickel oxide (NiOx), phthalocyanines, and plasma-deposited fluorocarbon (CFx).

70. The full-color microcavity OLED display device according to claim 54 wherein the device further includes a transparent electrically conductive and pixelated phase-layer disposed over the metallic bottom-electrode layer.

71. The full-color microcavity OLED display device according to claim 70 wherein the different selected cavity length is provided by selection of a different thickness of the pixelated phase-layer in correspondence with the red, green, and blue subpixels, respectively.

72. The full-color microcavity OLED display device according to claim 54 wherein the at least one organic host material is selected to have a band gap energy level which is higher than a band gap energy level of each of the selected fluorescent or phosphorescent dye dopant materials.

73. The full-color microcavity OLED display device according to claim 72 wherein the at least one organic host material is a hole-transporting host material.

74. The full-color microcavity OLED display device according to claim 72 wherein the at least one organic host material is an electron-transporting host material.

* * * * *